(12) United States Patent
Harakawa et al.

(10) Patent No.: US 11,579,180 B2
(45) Date of Patent: Feb. 14, 2023

(54) INSULATION DIAGNOSTIC SYSTEM AND INSULATION DIAGNOSTIC METHOD

(71) Applicants: KABUSHIKI KAISHA TOSHIBA, Tokyo (JP); TOSHIBA ENERGY SYSTEMS & SOLUTIONS CORPORATION, Kawasaki (JP)

(72) Inventors: Takashi Harakawa, Yokohama (JP); Makoto Takanezawa, Yokohama (JP); Akira Fujimoto, Yokohama (JP); Satoshi Hiroshima, Mie (JP); Kazunori Shioda, Minato (JP)

(73) Assignees: KABUSHIKI KAISHA TOSHIBA, Tokyo (JP); TOSHIBA ENERGY SYSTEMS & SOLUTIONS COPORATION, Kawasaki (JP)

( * ) Notice: Subject to any disclaimer, the term of this patent is extended or adjusted under 35 U.S.C. 154(b) by 0 days.

(21) Appl. No.: 17/646,066

(22) Filed: Dec. 27, 2021

(65) Prior Publication Data

US 2022/0221501 A1 Jul. 14, 2022

(30) Foreign Application Priority Data

Jan. 8, 2021 (JP) .............................. JP2021-001838

(51) Int. Cl.
*G01R 31/08* (2020.01)
*G01R 31/12* (2020.01)
*G01R 31/34* (2020.01)

(52) U.S. Cl.
CPC ....... *G01R 31/1227* (2013.01); *G01R 31/343* (2013.01)

(58) Field of Classification Search
CPC ................ G01R 31/12; G01R 31/1209; G01R 31/1227; G01R 31/1254; G01R 31/1281;
(Continued)

(56) References Cited

U.S. PATENT DOCUMENTS 7,183,774 B2 * 2/2007 Kuppuswamy .... G01R 31/1254
324/536
2007/0139056 A1 6/2007 Kaneiwa et al.
(Continued)

FOREIGN PATENT DOCUMENTS

JP 8-166421 A 6/1996
JP 2002-90413 A 3/2002
(Continued)

*Primary Examiner* — Thang X Le
(74) *Attorney, Agent, or Firm* — Oblon, McClelland, Maier & Neustadt, L.L.P.

(57) ABSTRACT

According to one embodiment, an insulation diagnostic system comprising: a peak-value acquisition circuit configured to acquire at least one peak value of a section corresponding to local discharge of a voltage signal acquired by at least one sensor that detects the voltage signal in a non-contact manner; a function acquisition circuit configured to acquire a calculation function for calculating charge amount related to the discharge based on at least two peak values acquired from the voltage signal that is detected by the sensor by applying a test voltage to a rotating electrical machine while the rotating electrical machine is stopped; and a charge-amount calculation circuit configured to calculate the charge amount related to partial discharge of the rotating electrical machine based on the calculation function and the peak value obtained from the voltage signal that is detected by the sensor during operation of the rotating electrical machine.

15 Claims, 12 Drawing Sheets

(58) Field of Classification Search
CPC .... G01R 31/14; G01R 31/02; G01R 31/1272; G01R 31/08; G01R 31/11; G01R 31/16; G01R 31/28; G01R 31/085; G01R 31/34; G01R 31/346; G01R 31/343
See application file for complete search history.

(56) References Cited

U.S. PATENT DOCUMENTS

| | | | |
|---|---|---|---|
| 2008/0048710 A1* | 2/2008 | Cem | G01R 31/1272 324/536 |
| 2009/0119035 A1* | 5/2009 | Younsi | G01R 31/343 702/58 |
| 2009/0146666 A1 | 6/2009 | Ohtsuka et al. | |
| 2010/0271002 A1* | 10/2010 | Wakimoto | G01R 31/34 324/76.21 |
| 2014/0159755 A1 | 6/2014 | Sumi et al. | |
| 2022/0065915 A1* | 3/2022 | Zhang | G01R 31/343 |

FOREIGN PATENT DOCUMENTS

| | | |
|---|---|---|
| JP | 2006-58166 A | 3/2006 |
| JP | WO 2007/063647 A1 | 6/2007 |
| JP | 2012-112696 A | 6/2012 |
| JP | 2014-115237 A | 6/2014 |
| JP | WO 2015/190260 A1 | 12/2015 |

\* cited by examiner

INSULATION DIAGNOSTIC SYSTEM AND INSULATION DIAGNOSTIC METHOD

CROSS-REFERENCE TO RELATED APPLICATION

This application is based upon and claims the benefit of priority from Japanese Patent Application No. 2021-001838, filed on Jan. 8, 2021, the entire contents of which are incorporated herein by reference.

FIELD

Embodiments of the present invention relate to insulation diagnostic techniques.

BACKGROUND

A rotating electrical machine is composed of a metal material such as copper and iron and/or an insulating material mainly made of resin. These materials deteriorate under electrical, thermal, mechanical, and environmental stress during operation of the rotating electrical machine. In particular, the insulating material is more unstable than the metal material, and thus, deteriorates faster. For this reason, in order to prevent the rotating electrical machine from deteriorating and causing electrical breakdown (i.e., dielectric breakdown) during operation and in order to operate the rotating electrical machine normally, it is necessary to periodically diagnose the reliability of the rotating electrical machine. Conventional diagnostic methods include an insulation resistance test, a withstand voltage test, an alternating current test, a dielectric loss tangent test, and a partial discharge test. In particular, the partial discharge test captures partial discharge, which is a precursory phenomenon of electrical breakdown, and also captures local deterioration. So the partial discharge test is suitable for insulation diagnosis in the case of considering the diagnosis target as the weakest link model.

The partial discharge test includes: a contact method in which the object to be measured and the measuring device are coupled by a capacitor; and a non-contact method in which the object to be measured and the measuring device are spatially coupled by capacitive coupling. In the contact method, an electrostatic capacitance larger than the stray capacitance can be intentionally incorporated into the circuit. However, the installation of the measuring device requires advance preparation such as capacitor connection and insulation design. In addition, in the case of incorporating the measuring device into an existing rotating electrical machine, due to the large amount of work required to connect the capacitors, the power outage period of the rotating electrical machine will be significantly longer. The non-contact method uses a small electrostatic capacitance equivalent to the stray capacitance, and thus is difficult to accurately measure the electrostatic capacitance. However, as compared with the contact method, the non-contact method has a higher degree of freedom that the measuring device can be installed anywhere.

Diagnosis of the rotating electrical machine includes offline diagnosis to be performed while it is stopped and online diagnosis to be performed while it is driving. The offline diagnosis can be performed by directly contacting the measuring device with the rotating electrical machine, and thus, can be applied to any one of the contact method and the non-contact method. However, in the online diagnosis, in order to prevent the rotating electrical machine from stopping due to a malfunction of the breaker, it is necessary to eliminate the noise signal that flows back from the measuring device to the system of the rotating electrical machine. Hence, it is preferred that diagnosis of the rotating electrical machine is performed by the non-contact method.

In recent years, many rotating electrical machines have been desired to improve their operating rate, and attention is focused on the non-contact online partial discharge diagnosis that can be performed during operation. In a known technique of such non-contact online partial discharge diagnosis, a voltage signal is acquired by a sensor installed at a distance from a high-voltage conductor and the presence/absence of partial discharge is determined on the basis of the information obtained from the voltage signal.

In the insulation diagnostic technology for the rotating electrical machine, it is desired to improve the operating rate of the rotating electrical machine by determining the residual life of the rotating electrical machine from the information obtained by the sensor. However, the information obtained by the sensor is a relative value of charge amount (i.e., amount of electric charge) indicating discharge strength, and thus, it is necessary to individually determine the threshold value serving as an index of the insulation diagnosis for each model of sensor. Regardless of which model of sensor is used, in order to perform insulation diagnosis using the same threshold value, it is necessary to convert the information obtained by the sensor into charge amount.

In view of the above-described circumstances, an object of the present invention is to provide an insulation diagnostic technique that can convert a voltage signal acquired by a sensor into charge amount to be used as an index for insulation diagnosis.

DETAILED DESCRIPTION

In one embodiment of the present invention, an insulation diagnostic system comprising: a peak-value acquisition circuit configured to acquire at least one peak value of a section corresponding to local discharge of a voltage signal acquired by at least one sensor that detects the voltage signal in a non-contact manner, the voltage signal being a signal propagating through a conductor connected to a rotating electrical machine; a function acquisition circuit configured to acquire a calculation function for calculating charge amount related to the discharge based on at least two peak values acquired from the voltage signal that is detected by the sensor by applying a test voltage to the rotating electrical machine while the rotating electrical machine is stopped; and a charge-amount calculation circuit configured to calculate the charge amount related to partial discharge of the rotating electrical machine based on the calculation function and the peak value obtained from the voltage signal that is detected by the sensor during operation of the rotating electrical machine.

In another embodiment of the present invention, an insulation diagnostic system comprising: a spectrum acquisition circuit configured to acquire a spectrum of a section corresponding to local discharge of a voltage signal obtained by at least one sensor that detects the voltage signal in a non-contact manner, the voltage signal being a signal propagating through a conductor connected to a rotating electrical machine; a coefficient acquisition circuit configured to acquire a conversion coefficient represented by a ratio between two spectra corresponding to respective two points obtained from the voltage signal that is detected by the sensor by applying a test voltage to the two points while the rotating electrical machine is stopped, the two points including a point of a measurement target of the rotating electrical machine and a point of the sensor; a waveform restoration circuit configured to restore a time waveform of the voltage signal at an occurrence time of partial discharge at the point of the measurement target, based on the conversion coefficient and the spectrum obtained from the voltage signal detected by the sensor during operation of the rotating electrical machine; and a charge-amount calculation circuit configured to calculate charge amount related to the partial discharge from the time waveform.

First Embodiment

Hereinbelow, embodiments of an insulation diagnostic system and an insulation diagnostic method will be described in detail by referring to the accompanying drawings. First, a description will be given of the insulation diagnostic system and the insulation diagnostic method of the first embodiment by referring to FIG. 1 to FIG. 5.

Figure 1:
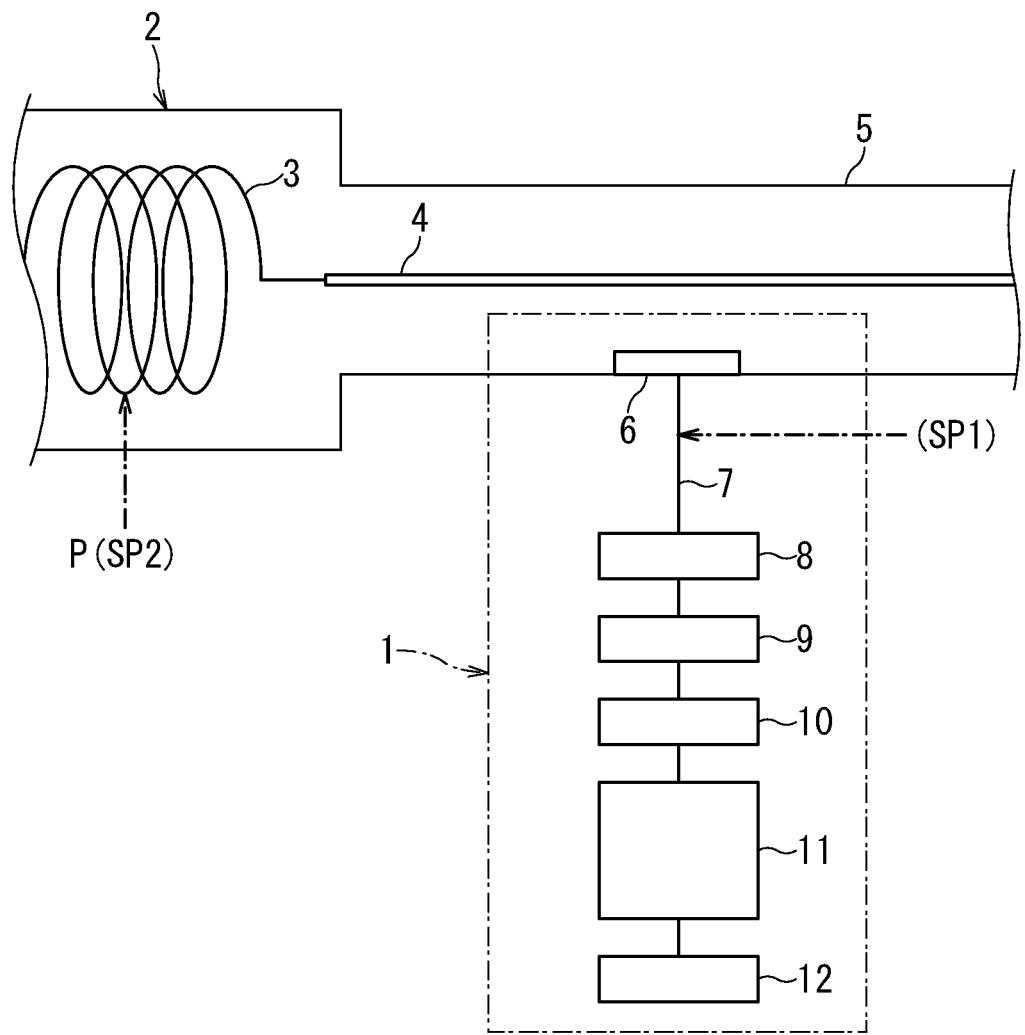
FIG. 1 is a configuration diagram illustrating an insulation diagnostic system.

The reference sign 1 in FIG. 1 indicates an insulation diagnostic system. This insulation diagnostic system 1 is used to perform non-contact online partial discharge diagnosis of a rotating electrical machine 2. In particular, the insulation diagnostic system 1 diagnoses the residual life of the rotating electrical machine 2 by measuring charge amount related to partial discharge. The rotating electrical machine 2 to be measured is, for example, a power generator and/or an electric motor.

The rotating electrical machine 2 is composed of a metal material such as copper and iron, which are conductors, and an insulating material mainly made of resin. For example, the rotating electrical machine 2 includes a coil 3 as a conductor. This coil 3 is connected to a bus line 4 that is a conductor. The bus line 4 is provided inside a housing 5 of the rotating electrical machine 2, for example.

The insulation diagnostic system 1 includes: a sensor 6; a coaxial cable 7; a high-frequency amplifier 8; a detection impedance 9; an A/D converter 10; a diagnosis apparatus 11; and a display 12.

The sensor 6 detects the voltage signal propagating through the bus line 4 (conductor) in a non-contact manner. The voltage signal of this sensor 6 is inputted to the high-frequency amplifier 8 via the coaxial cable 7. Subsequently, the voltage signal is inputted to the A/D converter 10 via the detection impedance 9 and converted from the analog signal to the digital signal by the A/D converter 10. This digital signal is inputted to the diagnosis apparatus 11, and the diagnostic result derived by the diagnosis apparatus 11 is displayed on the display 12.

The partial discharge test is a test to detect the discharge to be generated between the grounding portion and the conductor such as the coil 3 when a high voltage is applied to this conductor. Discharge often occurs at defective points such as voids and delamination of the insulating material. At the time of discharge, movement of electrons is occurring, and consequently, a high-frequency current change propagates in the conductor as a signal. In the partial discharge test, the discharge amount and the discharge intensity are measured by detecting the change in (electric) current.

The change in current to be generated by the partial discharge is very weak. As a method for accurately measuring this weak change in current, a known voltage measurement method uses the high-frequency amplifier 8 having a high-pass filter and the detection impedance 9. The high-frequency amplifier 8 is intended to amplify the weak discharge signal and amplify the discharge signal such that the discharge signal can be measured with the sensitivity of the diagnosis apparatus 11.

It is preferred that the cutoff frequency of the high-pass filter is higher than the commercial frequency to be used in the rotating electrical machine 2. When the rotating electrical machine 2 is a power generator, the cutoff frequency of the high-pass filter is preferably higher than 60 Hz. The cutoff frequency of the high pass filter is preferably higher than 120 Hz in the case of blocking up to double frequency, and is preferably 1 kHz or higher in the case of sufficiently blocking components irrelevant to the discharge signal.

Preferably, the detection impedance 9 matches the characteristic impedance of the coaxial cable 7 that is used for preventing noise intrusion during signal propagation from the rotating electrical machine 2 as the measurement target to the diagnosis apparatus. This is because difference in impedance causes signal reflection and subsequently causes distortion of the original waveform to make analysis difficult. The detection impedance 9 is often replaced by input impedance of an oscilloscope, and it is common to use 50Ω, which is often used in the oscilloscope, as the detection impedance 9. Thus, it is preferred that the coaxial cable 7 to be used has a characteristic impedance of 50Ω.

The signal detected by the detection impedance 9 is obtained as a voltage value, and this voltage value can be converted into a current value by dividing this voltage value by the detection impedance 9. Thus, the signal detected by the detection impedance 9 is essentially a value having a meaning of a current value. Subsequently, from the viewpoint of data storage or analysis, the analog signal detected by the detection impedance 9 is converted into a digital signal by the A/D converter 10, and the diagnosis apparatus 11 calculates the discharge amount and the discharge intensity from the digital signal.

Figure 2:
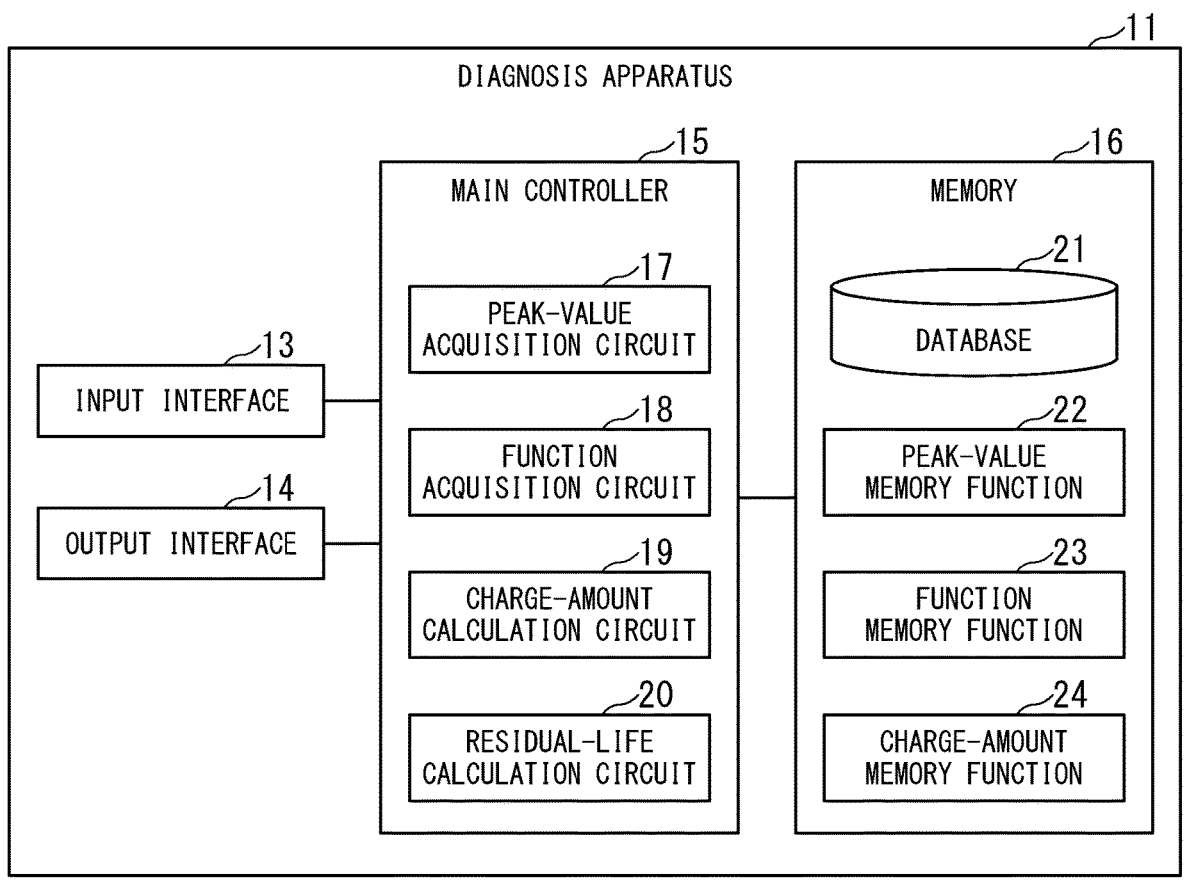
FIG. 2 is a block diagram illustrating a diagnosis apparatus of the first embodiment.

Next, the system configuration of the diagnosis apparatus 11 will be described by referring to the block diagram shown in FIG. 2. The diagnosis apparatus 11 includes an input interface 13, an output interface 14, a main controller 15, and a memory 16. The diagnosis apparatus 11 includes hardware resources such as a Central Processing Unit (CPU), a Read Only Memory (ROM), a Random Access Memory (RAM), and a Hard Disc Drive (HDD), and is configured as a computer in which information processing by software is achieved with the use of the hardware resources by causing the CPU to execute various programs. Further, the insulation diagnostic method of the present embodiment is achieved by causing the computer to execute the various programs.

The voltage signal detected by the sensor 6 is inputted to the input interface 13. For example, the digital signal converted by the A/D converter 10 is inputted to the input interface 13. The input aspect of the voltage signal is not limited to the case where the voltage signal is inputted to the input interface 13 in real time from the sensor 6. The voltage signal may be inputted in another aspect. For example, the voltage signal detected by the sensor 6 may be temporarily stored in another recording device and then the voltage signal stored in this recording device may be inputted to the input interface 13 of the diagnosis apparatus 11.

Predetermined information may be inputted to the input interface 13 in response to the operation by the user who uses the system. For example, the input interface 13 includes an input device such as a mouse and a keyboard. That is, the predetermined information is inputted to the input interface 13 depending on the operation on these input devices.

The output interface 14 outputs the predetermined information. This output interface 14 controls images to be displayed on the display 12. The display 12 may be separated from the main body of the computer or may be integrated with the main body of the computer. Additionally or alternatively, the output interface 14 may control images to be displayed on the display 12 of other computers interconnected via the network.

Although the display 12 is exemplified as a device for displaying an image in the present embodiment, display of an image may be executed by other methods. For example, a printer configured to print information on a paper medium may be used instead of the display 12. That is, the printer may be included in an object to be controlled by the output interface 14.

The main controller 15 integrally controls, i.e., controls the entirety of the insulation diagnostic system 1. This main controller 15 includes a peak-value acquisition circuit 17, a function acquisition circuit 18, a charge-amount calculation circuit 19, and a residual-life calculation circuit 20. These functions 17 to 20 are implemented by causing its CPU to execute the programs stored in the memory or the HDD.

Each configuration of the diagnosis apparatus 11 does not necessarily have to be provided on one computer. For example, one diagnosis apparatus 11 may be achieved by using a plurality of computers interconnected by a network in combination. For example, the function acquisition circuit 18, the charge-amount calculation circuit 19, and the residual-life calculation circuit 20 may be individually installed in respective each of computers.

The memory 16 stores various information necessary for performing the insulation diagnosis of the rotating electrical machine 2. The memory 16 has a database 21. This database 21 is collection of organized information items stored in a memory, the HDD, or cloud in such a manner that a necessary information item can be searched and a further information item can be added.

Further, the memory 16 has: a peak-value memory function 22 that stores each peak value acquired by the peak-value acquisition circuit 17; a function memory function 23 that stores the calculation function acquired by the function acquisition circuit 18; and a charge-amount memory function 24 that stores the charge amount related to the partial discharge of the rotating electrical machine 2 calculated by the charge-amount calculation circuit 19.

The database 21 stores residual-life information indicating the relationship between the charge amount related to the partial discharge of the rotating electrical machine 2 and the residual life of the rotating electrical machine 2. In this manner, the residual-life information can be accumulated in the database 21 in advance, and the residual life can be calculated on the basis of this accumulation.

Next, a description will be given of the insulation diagnostic method to be executed by the insulation diagnostic system 1 of the first embodiment on the basis of the step number in the flowchart of FIG. 3 by referring to FIG. 1 and FIG. 2 as required.

Figure 3:
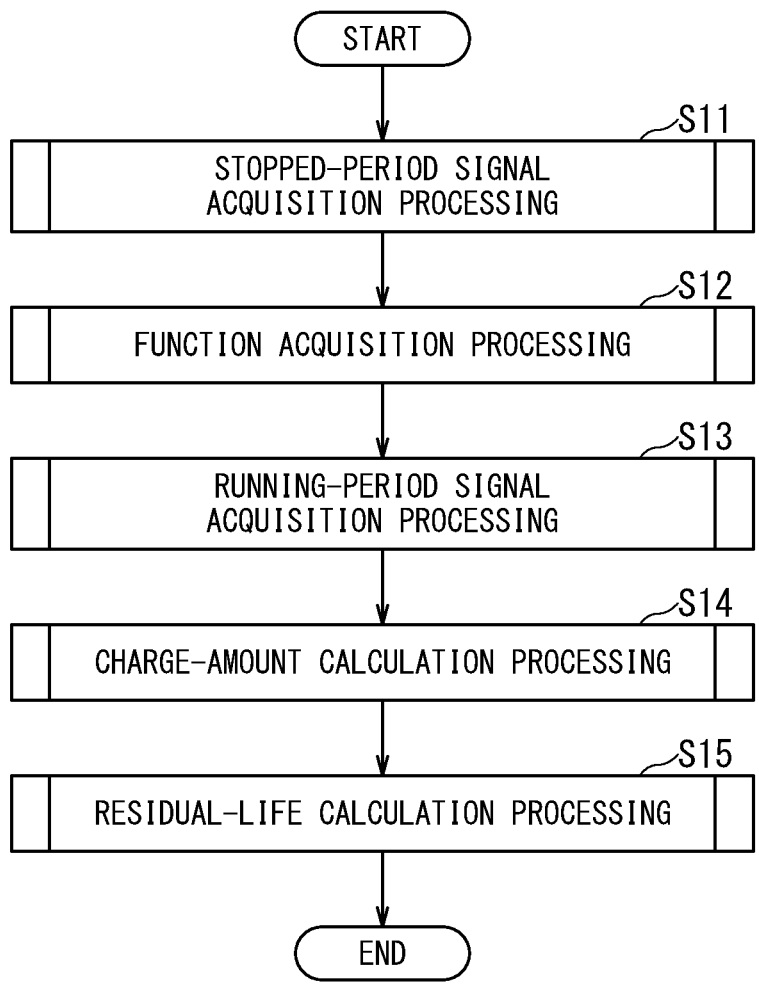
FIG. 3 is a flowchart illustrating an insulation diagnostic method of the first embodiment.

First, in the step S11 of FIG. 3, the peak-value acquisition circuit 17 executes stopped-period signal acquisition processing (i.e., offline-time signal acquisition processing to be performed in a period during which the target device of insulation diagnosis is stopped or turned off). While the rotating electrical machine 2 is stopped, the operator applies a test voltage, which is a simulated discharge with a known charge amount, to the rotating electrical machine 2. Subsequently, the peak-value acquisition circuit 17 acquires the peak value of the section corresponding to the local discharge of the voltage signal obtained by the sensor 6 while the rotating electrical machine 2 is stopped. The operator applies the test voltage a plurality of times.

For example, the test voltage is inputted to the measurement target point P (FIG. 1) of the coil 3. The peak-value acquisition circuit 17 acquires the respective peak values in the waveform of the test voltage. In addition, the memory 16 stores the acquired peak values.

In the next step S12, the function acquisition circuit 18 executes function acquisition processing. In detail, the function acquisition circuit 18 acquires a calculation function for calculating the charge amount related to discharge on the basis of at least two peak values, which are obtained from the voltage signal detected by the sensor 6 while the rotating electrical machine 2 is stopped. In addition, the memory 16 stores the acquired calculation function.

In the next step S13, the peak-value acquisition circuit 17 executes running-period signal acquisition processing (i.e., online-time signal acquisition processing to be performed while the target device of insulation diagnosis is in operation). In detail, the peak-value acquisition circuit 17 acquires each peak value of the section corresponding to the local discharge of the voltage signal obtained by the sensor 6 during the operation of the rotating electrical machine 2. In addition, the memory 16 stores the acquired peak values.

In the next step S14, the charge-amount calculation circuit 19 executes charge amount calculation processing. In detail, the charge-amount calculation circuit 19 calculates the charge amount related to the partial discharge of the rotating electrical machine 2 on the basis of the calculation function calculated by the function acquisition circuit 18 and the peak value (s) obtained from the voltage signal detected by the sensor 6 during operation of the rotating electrical machine 2. In addition, the memory 16 stores the calculated charge amount.

In the next step S15, the residual-life calculation circuit 20 executes residua-life calculation processing. In detail, the residual-life calculation circuit 20 calculates the residual life of the rotating electrical machine 2 from the charge amount related to the partial discharge and the residual-life information stored in the database 21. Afterward, the insulation diagnostic method is completed.

Next, a description will be given of the processing to be executed by the peak-value acquisition circuit 17 as a part of the running-period signal acquisition processing in detail. When acquiring one peak value, the peak-value acquisition circuit 17 mainly executes processing of two steps.

The first step is extraction of the section C1 (i.e., signal range) corresponding to discharge. Although the voltage signal of partial discharge varies depending on the circuit configuration of the rotating electrical machine 2, its rise time is about 10 to 20 nanoseconds, for example. The rise time is time length from the timing when the voltage is zero to the timing when the voltage reaches the first extremum.

In order for the peak-value acquisition circuit 17 to sufficiently detect the voltage signal of the partial discharge which is a local discharge, it is preferred that the peak-value acquisition circuit 17 has a time resolution of 10 nanoseconds or less. Further, in order to more satisfactorily detect the voltage signal, the peak-value acquisition circuit 17 desirably has a time resolution of 2 nanoseconds or less, which is one-fifth of 10 nanoseconds. Moreover, in order to further satisfactorily detect the voltage signal, the peak-value acquisition circuit 17 desirably has a time resolution of 1 nanosecond or less, which is one tenth of 10 nanoseconds.

Accordingly, for example, in order to obtain the characteristics of the voltage signal of partial discharge per 1 second, it is necessary to handle 1 gigapoint of data. Of these data, the voltage signal for partial discharge occupies slight amount and most of the remaining data are noise. Thus, the peak-value acquisition circuit 17 extracts the section C1 (FIG. 4) corresponding to the discharge in the time waveform.

Figure 4:
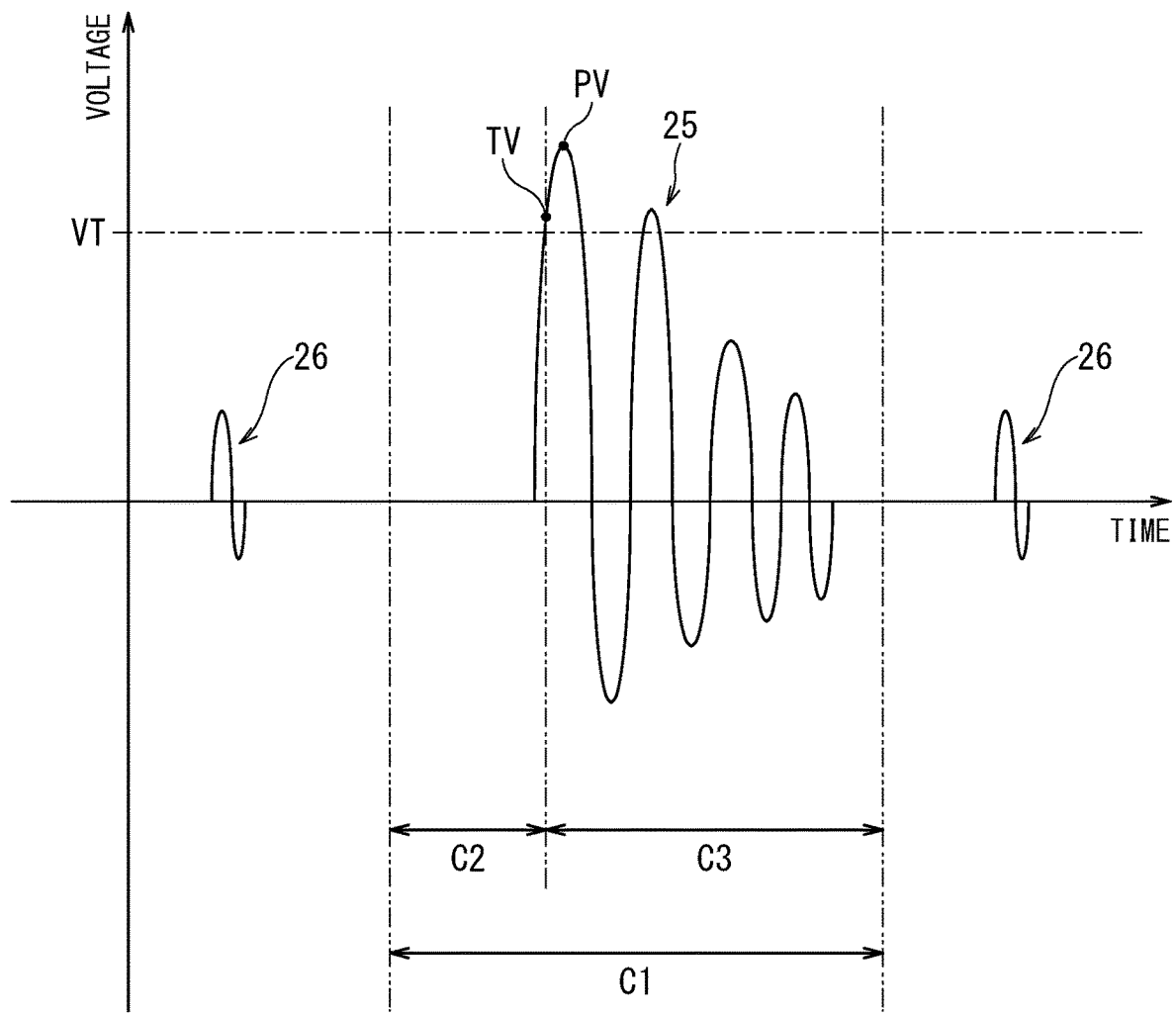
FIG. 4 is a graph illustrating a waveform of a voltage signal detected by a sensor.

As shown in FIG. 4, when the section C1 corresponding to the discharge is extracted, first, the approximate position (i.e., time-range) of the voltage signal 25 of the partial discharge is detected from the waveform. The characteristic of the voltage signal 25 of partial discharge is that a signal strength clearly higher than the signal strength of the noise voltage signal 26 is generated. For this reason, the trigger voltage VT, which is the reference for the voltage signal 25 of the partial discharge, is set in advance. The peak-value acquisition circuit 17 captures the approximate position (i.e., time-range, where the voltage signal 25 of the partial discharge exists, with reference to the position of the reference voltage TV that exceeds the trigger voltage VT.

Although the trigger voltage VT and the reference voltage TV are almost the same, when the time waveform is digital data, the trigger voltage VT and the reference voltage TV are not exactly the same. This is because digital data represent change in voltage in discrete quantity. Thus, in the time waveform of digital data, the time point when the reference voltage TV is detected (i.e., clock time, or position in the time axis direction of the waveform) is the time point when the voltage signal 25 of the partial discharge is first acquired after exceeding the trigger voltage VT.

The voltage signal 25 of the partial discharge repeats reflection when it propagates through the circuit of the rotating electrical machine 2. Thus, the voltage signal 25 to be acquired by the sensor 6 has a waveform that fluctuates for a certain period of time. This fluctuating waveform portion also contains information on partial discharge. In order not to miss this information, it is necessary to extend the section C1 over a specific period before and after the time point (i.e., position in the time axis direction of the waveform) related to the reference voltage TV.

The range (i.e., specific period) of the section C1 differs depending on the definition method for disappearance of the reflected signal of the voltage signal 25 of the partial discharge due to attenuation, and is set in advance on the basis of the definition method. For example, the range C2 immediately before the appearance timing of the reference voltage TV is preferably 1 microsecond or less because the respective time points of the noise voltage signal 26 and the partial discharge voltage signal 25 are often close to each other. The range C3 immediately after the appearance timing of the reference voltage TV preferably has a sufficient time length in terms of capturing the fluctuation waveform, and is preferably 10 microseconds or less, for example. Furthermore, the range C3 immediately after the appearance timing of the reference voltage TV is preferably 5 microseconds or less from the viewpoint of reducing the amount of data.

After the section C1 corresponding to the discharge is determined, it is necessary to uniquely determine the time such that the time position in the time axis can be specified. Although the position may be anywhere within the section C1 corresponding to the discharge, from the viewpoint of easy understanding, the time position is preferably the time point when the reference voltage TV is detected (i.e., clock time or position in the time axis direction of the waveform). Afterward, the time point when the reference voltage TV is detected is defined as the identification number of the section C1 corresponding to the discharge, and the subsequent processing is performed.

The second step is extraction of the peak value PV of the section C1 corresponding to the discharge. Since the voltage signal 25 of the partial discharge repeats reflection in the circuit of the rotating electrical machine 2 as described above, it is difficult to detect the correlation between the charge amount and the feature quantity of the waveform. However, the propagation constant when the waveform is distorted by reflection is defined by the circuit configuration of the rotating electrical machine 2, and thus, the absolute maximum value of the waveform represents its feature quantity. At this time, the peak value PV is the maximum value as an absolute value in the section C1 corresponding to the discharge. In this manner, accuracy of calculating the charge amount related to the partial discharge can be improved.

The memory 16 stores the information on the peak value PV and the identification number of the section C1 corresponding to the discharge acquired by the peak-value acquisition circuit 17. Since these information items are stored in the memory 16, any information item on the peak value PV can be selected by searching and outputted arbitrarily. When a test voltage is applied to the coil 3, i.e., when a voltage of a known charge amount is inputted to the rotating electrical machine 2, the inputted charge amount is also included in the information to be stored in the memory 16.

Figure 5:
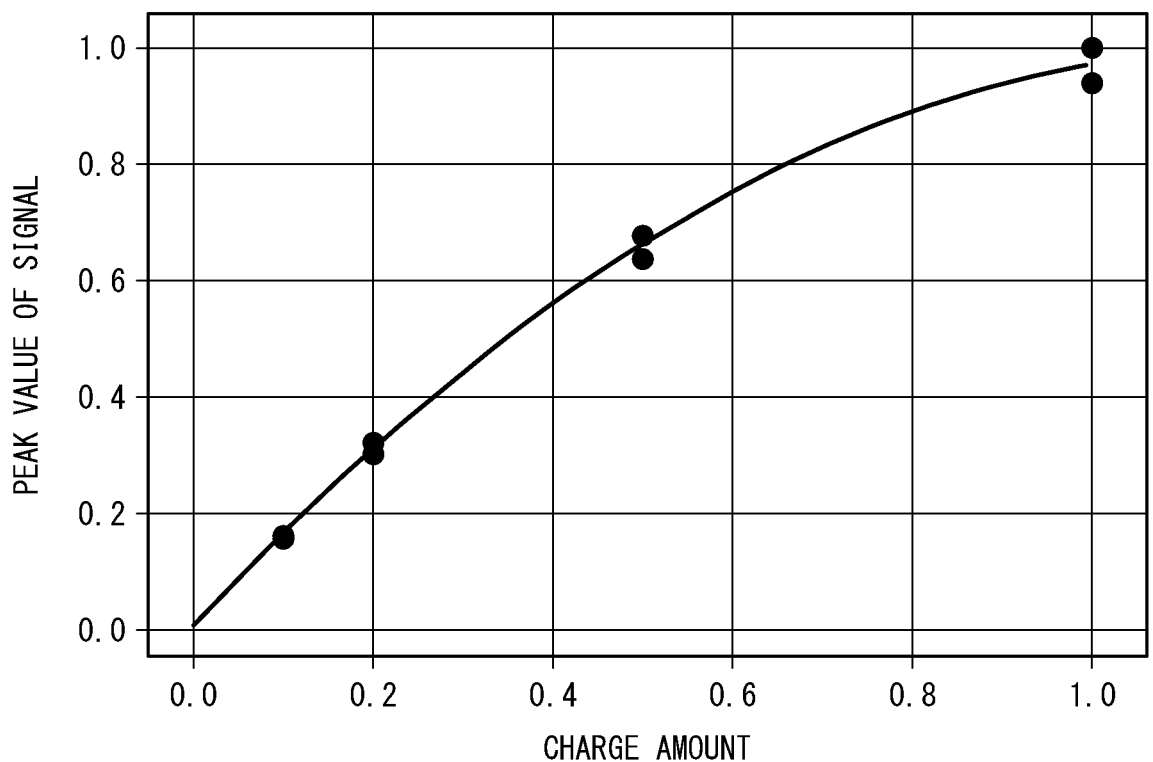
FIG. 5 is a graph illustrating relationship between charge amount and the peak value of the signal.

The function acquisition circuit 18 acquires its calculation function on the basis of the information on the peak value stored in the memory 16 and the known charge amount inputted by the test voltage. For example, the graph in FIG. 5 shows the change in peak value of the absolute value of the voltage signal when a known charge amount as test data is applied to the circuit of the rotating electrical machine 2.

As shown in this graph, there is a correlation between the charge amount and the peak value. In other words, when the peak value is known, the charge amount of the partial discharge can be estimated. At this time, the correlation between the two values is defined not by a linear graph but by a non-linear graph of a quadratic function or higher.

When the nonlinear graph contains the origin (0,0) at the time of defining the calculation function (i.e., at the time of performing charge calibration by peak value), it is preferred to acquire at least two or more test data showing the relationship between the charge amount and the peak value. When the nonlinear graph does not include the origin (0,0), it is preferred to acquire at least three or more test data showing the relationship between the charge amount and the peak value.

The memory 16 stores the order and the coefficient from the approximate expression of the calculation function acquired by the function acquisition circuit 18. When the function $f(x)=\Sigma a_i x^i$ is defined, the order and the coefficient are stored as "$a_m, a_m-1, \ldots, a_0$ (m>2)". At this time, the variable x is the peak value of the voltage signal of the partial discharge.

The charge-amount calculation circuit 19 acquires the information on the peak value and the identification number of the section C1 extracted by the peak-value acquisition circuit 17 as the voltage signal of the partial discharge, and calculates the charge amount on the basis on these information items and the calculation function acquired by the function acquisition circuit 18. Further, the memory 16 stores the identification number of the voltage signal of the partial discharge and the information on the charge amount calculated by the charge-amount calculation circuit 19.

The identification number of the voltage signal of the partial discharge is information for identifying the place where the partial discharge occurs, and indicates in which phase the discharge occurs with respect to the generated voltage when being compared with the voltage of the partial discharge generated by another rotating electrical machine 2, for example.

The discharge generation conditions are data showing the characteristics of the discharge, and are, for example, information necessary for identifying the discharge generation position or the discharge generation cause. In addition, the information on the charge amount is important information for knowing the absolute discharge generation strength. Thus, when the magnitude of the charge-amount information is evaluated, the deterioration state of the rotating electrical machine 2 can be determined. Further, the relationship between the discharge intensity and the discharge frequency can be diagnosed by combining the information on the charge amount and the identification number of the voltage signal of the partial discharge. Comprehensive evaluation or determination of such information items enables accurate estimation of the residual life of the rotating electrical machine 2.

The function acquisition circuit 18 of the first embodiment acquires at least two test data showing the relationship between the known peak value and the known charge amount when the test voltage is applied to the rotating electrical machine 2. The function acquisition circuit 18 acquires the calculation function from the graph of the approximate curve obtained from these test data.

The charge-amount calculation circuit 19 calculates an unknown charge amount from the newly acquired peak value on the basis of the calculation function. In this manner, an unknown charge amount can be calculated on the basis of the relationship between the known charge amount and the peak value.

Further, when the reference voltage TV being equal to or higher than the preset trigger voltage VT is detected by the sensor 6, at least one specific period before and after the detection time point of the reference voltage TV is set as the section C1. In this manner, an approximate position including information on partial discharge in the voltage signal can be determined.

Second Embodiment

Next, a description will be given of the insulation diagnostic system 1 and the insulation diagnostic method of the second embodiment on the basis of FIG. 6 to FIG. 9 by referring to the above-described figures as required. The components having the same configuration or function as the components in the above-described embodiment are denoted by the same reference signs, and duplicate description is omitted.

Figure 6:
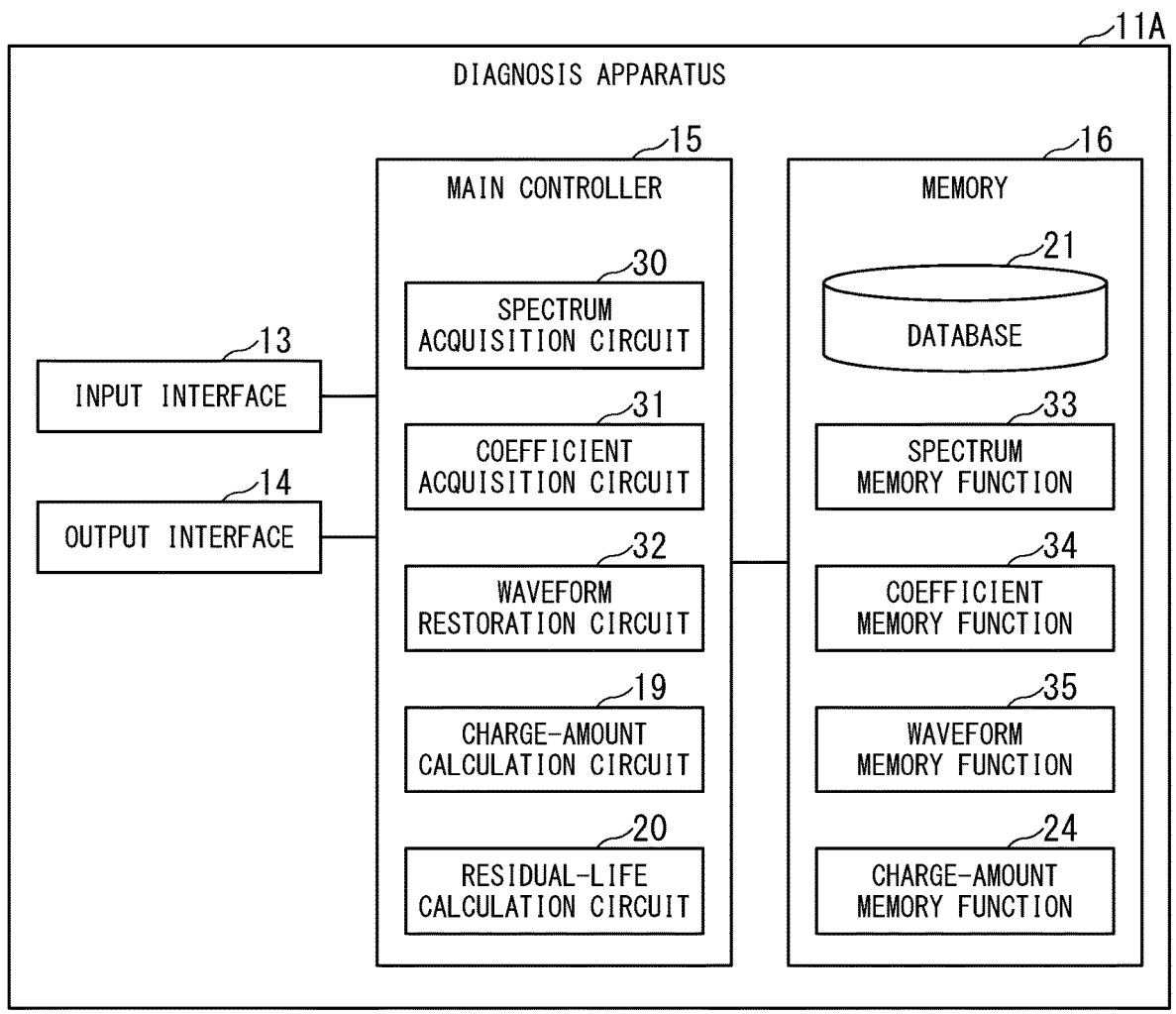
FIG. 6 is a block diagram illustrating the diagnosis apparatus of the second embodiment.

The system configuration of a diagnosis apparatus 11A of the second embodiment will be described by referring to the block diagram of FIG. 6. The diagnosis apparatus 11A includes the input interface 13, the output interface 14, the main controller 15, and the memory 16.

The main controller 15 centrally and integrally controls the insulation diagnostic system 1. This main controller 15 has a spectrum acquisition circuit 30, a coefficient acquisition circuit 31, a waveform restoration circuit 32, the charge-amount calculation circuit 19, and the residual-life calculation circuit 20. These functions are implemented by causing the CPU to execute the programs stored in the memory or the HDD.

Each configuration of the diagnosis apparatus 11A, does not necessarily have to be provided on one computer. For example, one diagnosis apparatus 11A may be achieved by using a plurality of computers interconnected by a network in combination. For example, the main controller 15 centrally and integrally controls the insulation diagnostic system 1. This main controller 15 may be configured such that the spectrum acquisition circuit 30, the coefficient acquisition circuit 31, the waveform restoration circuit 32, the charge-amount calculation circuit 19, and the residual-life calculation circuit 20 are individually installed in the respective five interconnected computers working in cooperation.

The memory 16 stores various information necessary for performing the insulation diagnosis of the rotating electrical machine 2. This memory 16 has the database 21. This database 21 is collection of organized information items stored in the memory, the HDD, or cloud in such a manner that a necessary information item can be searched and a further information item can be added.

Further, the memory 16 includes: a spectrum memory function 33 that stores spectrum information acquired by the spectrum acquisition circuit 30; a coefficient memory function 34 that stores a conversion coefficient acquired by the coefficient acquisition circuit 31; a waveform memory function 35 that stores the time waveform restored by the waveform restoration circuit 32; and the charge-amount memory function 24 that stores the charge amount related to the partial discharge of the rotating electrical machine 2 calculated by the charge-amount calculation circuit 19.

Next, a description will be given of the insulation diagnostic method to be executed by the insulation diagnostic system 1 of the second embodiment on the basis of the flowchart of FIG. 7 by referring to FIG. 1 and FIG. 6 as required.

Figure 7:
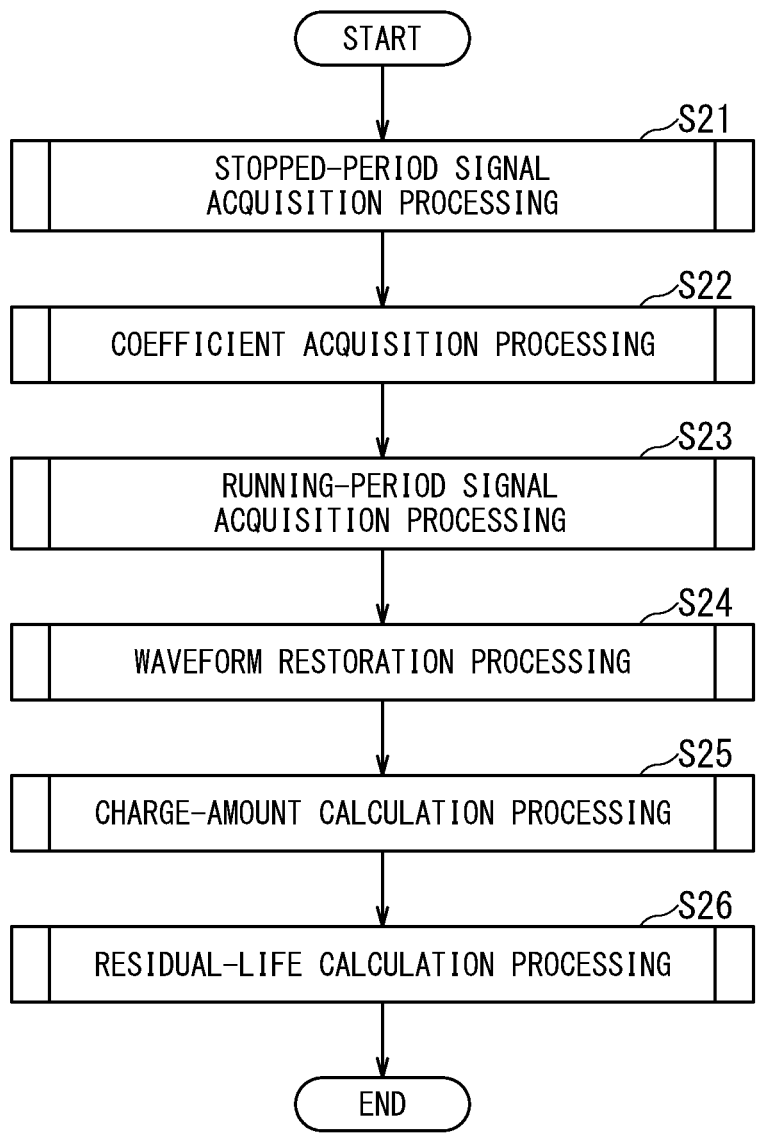
FIG. 7 is a flowchart illustrating the insulation diagnostic method of the second embodiment.

First, in the step S21 of FIG. 7, the spectrum acquisition circuit 30 executes the stopped-period signal acquisition processing. In detail, while the rotating electrical machine 2 is stopped, the operator applies a test voltage, which is a simulated discharge with a known charge amount, to the rotating electrical machine 2. Subsequently, the spectrum acquisition circuit 30 acquires the spectrum of the section corresponding to the local discharge of the voltage signal obtained by the sensor 6 while the rotating electrical machine 2 is stopped. The operator applies the test voltage a plurality of times.

For example, the operator applies the test voltage to two points that are SP1 (FIG. 1) between the sensor 6 and the high-frequency amplifier 8 and SP2 (FIG. 1) near the measurement target of the rotating electrical machine 2. The spectrum acquisition circuit 30 acquires the respective spectra of the two points SP1 and SP2 in response to the test voltage. In addition, the memory 16 stores the acquired spectra. As to the application point SP1 of the test voltage, it is sufficient if the application point SP1 is any position between the sensor 6 and the detection impedance 9.

In the next step S22, the coefficient acquisition circuit 31 executes the coefficient acquisition processing. In detail, while the rotating electrical machine 2 is stopped, the coefficient acquisition circuit 31 applies the test voltage to the two points including the point SP1 (FIG. 1) between the sensor 6 and the high-frequency amplifier 8 and the point SP2 (FIG. 1) of the measurement target point SP2 of the rotating electrical machine 2. The coefficient acquisition circuit 31 acquires a conversion coefficient represented by the ratio between the two spectra corresponding to the respective two points (SP1, SP2), which are obtained from the voltage signal detected by the diagnosis apparatus 11. In addition, the memory 16 stores the acquired conversion coefficient.

In the next step S23, the spectrum acquisition circuit 30 executes the running-period signal acquisition processing. In detail, while the rotating electrical machine 2 is in operation, the spectrum acquisition circuit 30 acquires the spectrum of the section corresponding to the local discharge of the voltage signal obtained by the sensor 6. In addition, the memory 16 stores the acquired spectrum.

In the next step S24, the waveform restoration circuit 32 executes waveform restoration processing. In detail, on the basis of the conversion coefficient obtained by the coefficient acquisition circuit 31 and the spectrum obtained from the voltage signal detected by the sensor 6 during operation of the rotating electrical machine 2, the waveform restoration circuit 32 restores the time waveform of the voltage signal at the occurrence timing of the partial discharge at the measurement target point SP (FIG. 1) of the rotating electrical machine 2.

In the next step S25, the charge-amount calculation circuit 19 executes charge-amount calculation processing. In detail, the charge-amount calculation circuit 19 calculates the charge amount related to the partial discharge of the rotating electrical machine 2 from the time waveform restored by the waveform restoration circuit 32. In addition, the memory 16 stores the calculated charge amount.

In the next step S26, the residual-life calculation circuit 20 executes residua-life calculation processing. In detail, the residual-life calculation circuit 20 calculates the residual life of the rotating electrical machine 2 from the residual-life information stored in the database 21 and the charge amount related to the partial discharge. Afterward, the insulation diagnostic method is completed.

Next, a description will be given of the processing to be executed by the spectrum acquisition circuit 30 as a part of the running-period signal acquisition processing in detail. In acquisition of one spectrum, the spectrum acquisition circuit 30 mainly performs two steps of processing.

The first step is the extraction of the section C1 (i.e., signal range) corresponding to the discharge. Since this extraction step of the section C1 is the same as the processing to be performed by the peak-value acquisition circuit 17 of the first embodiment described above, duplicate description is omitted. The spectrum acquisition circuit 30 extracts the section C1 (FIG. 4) corresponding to the discharge in the time waveform. Further, the identification number of the section C1 corresponding to the discharge is defined, and the subsequent processing is performed.

The second step is the spectral calculation of the section C1, which corresponds to the discharge. Considering that the time waveform is an aggregate of signals having different amplitudes and frequencies, the spectrum of the time wave form shows the result of decomposing the aggregate of the different signals. This spectral calculation can be achieved by Fourier transform. When the circuit of the rotating electrical machine 2 is configured to change its impedance depending on frequency, the spectrum represents its characteristics.

The memory 16 stores the information on the spectrum and the identification number of the section C1, which corresponds to the discharge and is acquired by the spectrum acquisition circuit 30. Since these information items are stored in the memory 16, any information item on the spectrum can be selected by searching and outputted arbitrarily. When the test voltage is applied to the coil 3, i.e., when a voltage of a known charge amount is inputted to the rotating electrical machine 2, the inputted charge amount is also included in the information to be stored in the memory 16.

The coefficient acquisition circuit 31 acquires the conversion coefficient, which is the ratio of the plurality of spectral information items stored in the memory 16. For example, the plurality of spectral information items include the first spectral information item and the second spectral information item.

The first spectrum information item is the spectrum acquired when the test voltage is applied to the point SP1 (FIG. 1) between the sensor 6 and the high-frequency amplifier 8, i.e., is the spectrum acquired when a known charge amount is directly inputted to the diagnosis apparatus 11A in order to eliminate reflection or attenuation due to signal propagation.

The second spectrum information item is the spectrum acquired when the test voltage is applied to the point SP2 (FIG. 1) in the vicinity of the measurement target of the rotating electrical machine 2, i.e., is the spectrum obtained when a known charge amount is inputted to the target position of measurement.

The ratio between the first spectrum and the second spectrum provides information indicating the effect of frequency characteristics on the signal due to reflection or attenuation during signal propagation. Thus, the original time waveform 36 (FIG. 9) at the point to be measured can be restored by the product of the spectrum of the voltage signal and the conversion coefficient, which is the ratio between the first spectrum and the second spectrum. In other words, the time waveform 36 (FIG. 9) at the occurrence time of the partial discharge at the point SP2 (FIG. 1) near the measurement target of the rotating electrical machine 2 can be restored from the time waveform (see the waveform of the voltage signal 25 in FIG. 4), which is acquired when the test voltage is applied to the point SP1 (FIG. 1) between the sensor 6 and the high-frequency amplifier 8.

The memory 16 stores the conversion coefficient acquired by the coefficient acquisition circuit 31. Since the conversion coefficient is a function of frequency, a plurality of conversion coefficients may be stored when at least one circuit constant changes like the rotating electrical machine 2.

As described above, the product of the conversion coefficient and the spectrum of the voltage signal is obtained. The purpose of this conversion is to restore the time waveform 36 (FIG. 9) at the occurrence point SP2 (FIG. 1) of the partial discharge. As the next processing, the waveform restoration circuit 32 restores the time waveform 36 from the product of the conversion coefficient and the spectrum of the voltage signal. Inverse Fourier transform is useful for this processing. The memory 16 stores the time waveform 36 restored by the waveform restoration circuit 32 and the identification number of the section C1 corresponding to the discharge in such a manner that both information items are associated with each other.

The charge-amount calculation circuit 19 calculates the charge amount from the time waveform 36 restored by the waveform restoration circuit 32. For example, the charge amount q is calculated on the basis of the following Expression 1.

$$q = \frac{1}{z_m} \int v \, dt \qquad \text{(Expression 1)}$$

In Expression 1, $z_m$ is the impedance value of the detection impedance 9, v is the time waveform 36, and dt is time derivative (i.e., temporal differentiation: time subtraction).

When the charge amount is obtained by integration based on the above-described procedure, in some cases, the background of the time waveform 36 does not become zero due to the influence of noise. This is an error, and if all of the time waveform 36 is integrated in this state, the charge amount becomes abnormally large in some cases. In order to integrate the time waveform 36 correctly, it is effective to offset the time waveform 36.

Figure 8:
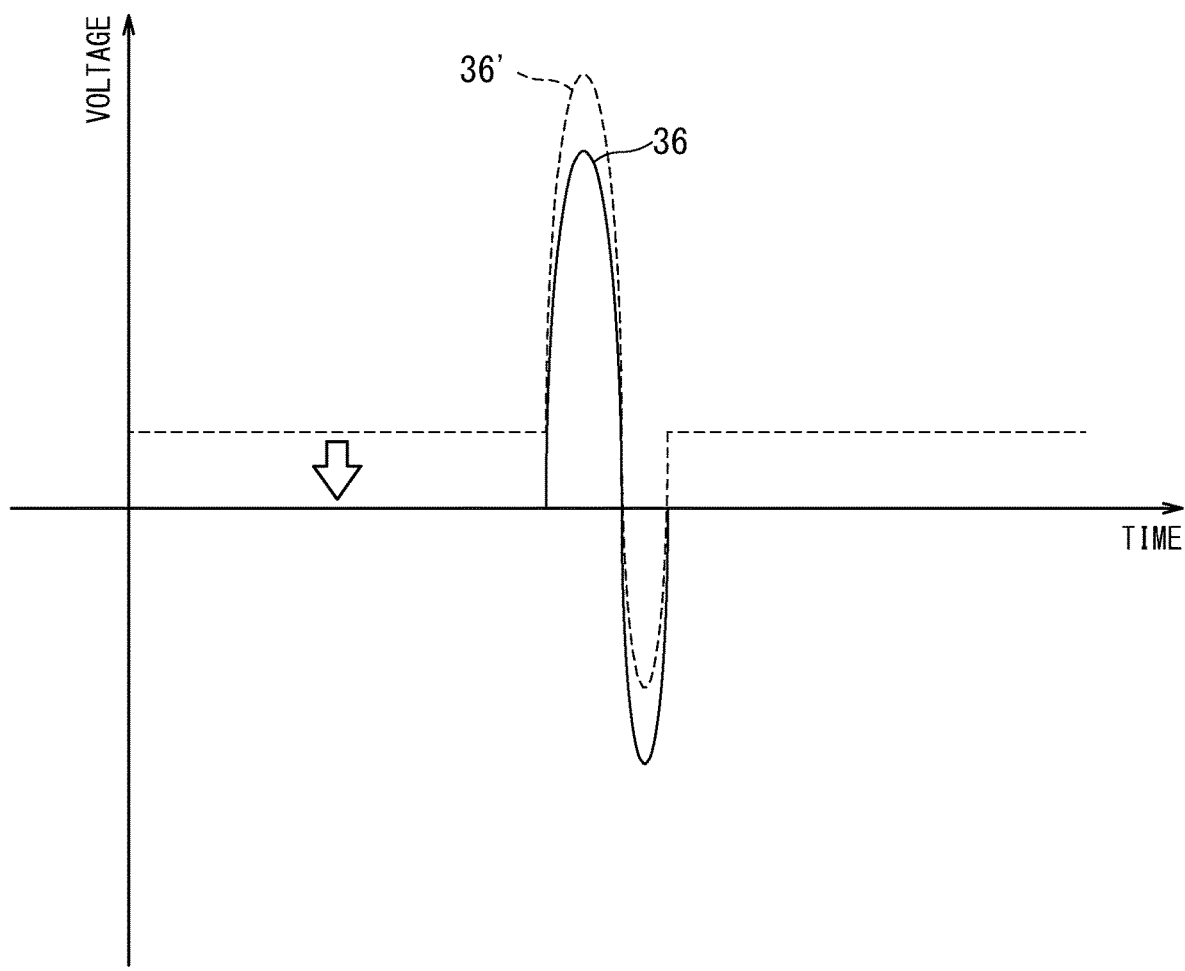
FIG. 8 is a graph illustrating a time waveform that is to be offset.

For example, it is assumed that there is a time waveform 36' including a noise waveform as shown in FIG. 8. Under this assumption, the charge-amount calculation circuit 19 acquires the average value of the noise waveform portion included in the time waveform 36', and offsets the entire time waveform 36' on the basis of this average value. In other words, the charge-amount calculation circuit 19 shifts the entire time waveform 36' only in the voltage-axis direction such that the background voltage value in the shifted time waveform becomes zero. In this manner, the charge-amount calculation circuit 19 can acquire the time waveform 36 which is the result of removing the noise waveform portion from the time waveform 36' used for calculating the charge amount.

As to the method for extracting the noise waveform portion, the noise may be extracted from the portion where the amount of time change in voltage signal (i.e., differential value) exceeds a certain threshold value. Additionally or alternatively, a threshold value may be set for the signal strength and the signal strength value below the threshold value may be identified as the noise to be extracted.

In addition, a method of defining the integration range is also effective. The characteristic of a valid voltage signal is that it is a value sufficiently larger than noise.

Figure 9:
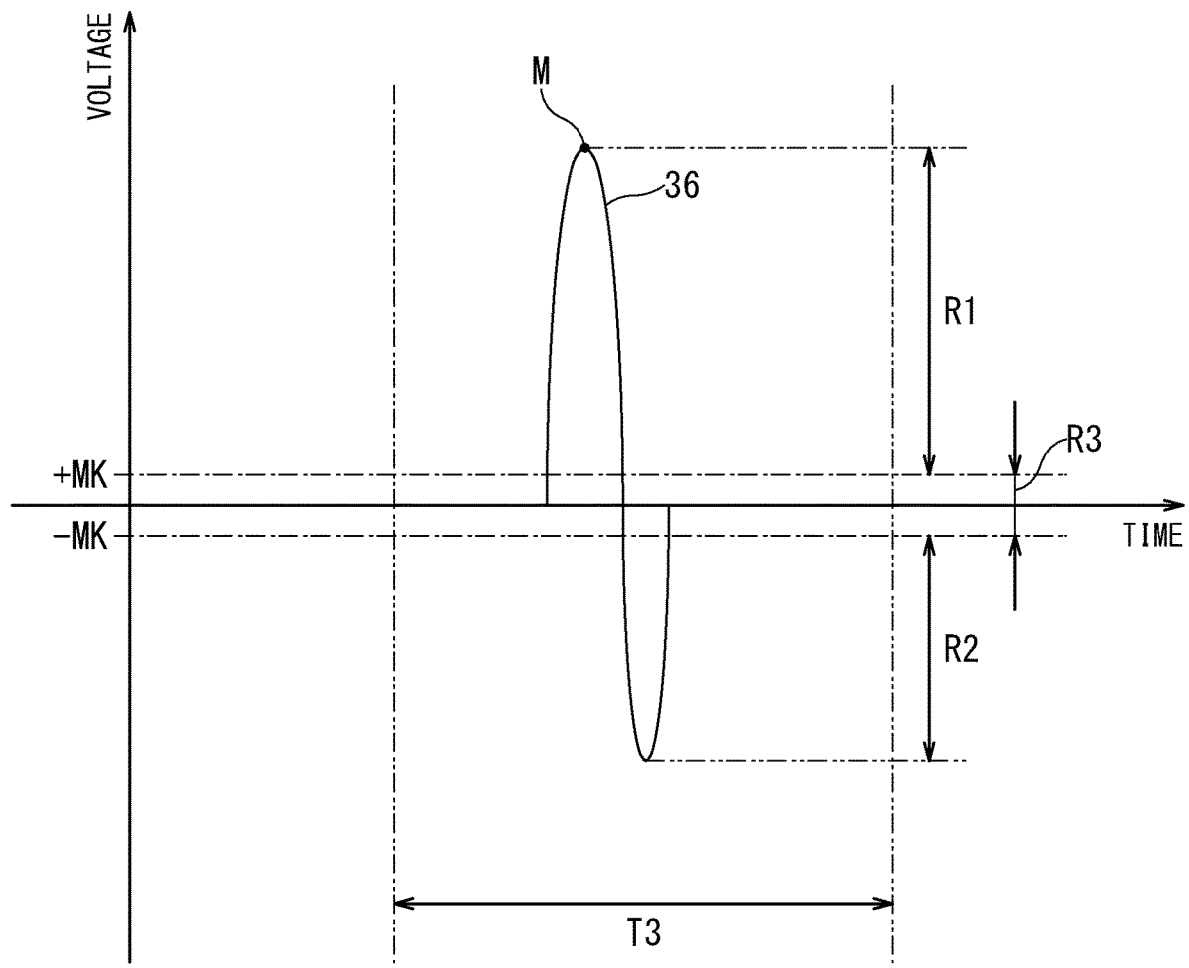
FIG. 9 is a graph illustrating the restored time waveform.

For example, as shown in FIG. 9, the maximum value M of the absolute value of the time waveform 36 is multiplied by a specific coefficient K (0<K<1). When an integration ranges R1 is set to a range where the signal value is the positive specific value (+MK) or higher and an integration ranges R2 is set to a range where the signal value is the negative specific value (−MK) or lower, the time waveform 36 of the effective integration ranges R1 and R2 without including noise can be specified.

That is, the charge-amount calculation circuit 19 of the second embodiment calculates the specific value (MK) by multiplying the maximum value (M) of the absolute value of the time waveform 36 by the specific coefficient (K). Further, the charge-amount calculation circuit 19 calculates the charge amount from the time waveform 36 in the range R1 where the signal value is the positive specific value (+MK) or higher and in the range R2 where signa value is the negative specific value (−MK) or lower. In this manner, the charge amount can be calculated by using the time waveform 36 in the effective ranges R1 and R2, where noise is relatively small enough to be negligible compared with the valid signal component or is not included. Since the range R3 from the positive specific value (+MK) to the negative specific value (−MK) contains unnecessary information excluding the partial discharge, this unnecessary information can be excluded from the target of integration.

As to the range of the specific coefficient K, if the specific coefficient K is too large, a large amount of valid signals fail to be extracted. If the specific coefficient K is too small, noise is included too much and the error becomes large. Thus, the range of the specific coefficient K is preferably the range of 0.1≤K≤0.5. In order to further enhance the calculation accuracy, the range of the specific coefficient K is preferably the range of 0.1≤K≤0.2.

In another method for defining the integration range, absolute values of signal values at respective time points of the time waveform 36 are arranged in descending order, and then, the range from the time point of the maximum value of the absolute values to the preset specific point (i.e., point N) is extracted as the integration range.

That is, the charge-amount calculation circuit 19 of the second embodiment extracts digital data in the range from the maximum value of the absolute values arranged in descending order to the preset specific point (i.e., point N) in the time waveform 36, and calculates the charge amount from these digital data. In this manner, the calculation accuracy of the charge amount can be enhanced by performing integration with the use of the digital data in the range that does not include noise.

The specific point (i.e., point N) changes depending on the sampling conditions of the digital data and may be set appropriately depending on the conditions. For example, the specific point N can be defined at a point where the slope (change amount S of the absolute value) in the case of arranging the absolute values of the time waveform 36 in order is larger in sensitivity than the maximum value M. When such a sensitivity coefficient is defined as L (S=LM), 0<L<0.5 holds. Further, in the case of increasing the sensitivity, L is preferably in the range of 0<L<0.2.

The charge-amount calculation circuit 19 of the second embodiment uses the above-described Expression 1 to calculate the charge amount for the time waveform 36, integration range of which is defined. The integration is performed by the absolute values of the time waveform 36.

This is because the waveform of the original voltage signal has a convex shape in either positive or negative direction whereas the obtained time waveform 36 cannot be completely reproduced in some cases. Since this unreproducible portion is obtained by reversing the positive and negative due to the influence of reflection, it is included as a valid signal, and thus, the above-described integration is performed by using the absolute values of the time waveform 36.

After above-described integration, the integrated value is divided by the impedance value of the detection impedance 9 for conversion to the electric-current value to obtain the charge amount. The memory 16 stores the identification number of the voltage signal of the partial discharge and the information on the charge amount calculated by the charge-amount calculation circuit 19.

As described above, the charge-amount calculation circuit 19 of the second embodiment calculates the charge amount on the basis of the quotient, which is obtained by dividing the sum of the products of the absolute values of the time waveform 36 and the time derivative by the impedance value of the detection impedance 9. In this manner, when the time waveform 36 during partial discharge is not completely restored, this unrestored portion, where the positive and negative values are reversed due to the influence of reflection, can be used for calculating the charge amount.

Further, the relationship between the discharge intensity and the discharge frequency can be diagnosed by combining the identification number of the voltage signal of the partial discharge and information on the charge amount. Comprehensive evaluation or determination of such information enables accurate estimation of the residual life of the rotating electrical machine 2.

Third Embodiment

Next, a description will be given of the insulation diagnostic system 1 and the insulation diagnostic method of the third embodiment on the basis of FIG. 10 by referring to the above-described figures as required. The components having the same configuration or function as the components in the above-described embodiments are denoted by the same reference signs, and duplicate description is omitted.

In the third embodiment, a detailed description will be given of the residua-life calculation processing (FIG. 3 and FIG. 7) to be executed by the residual-life calculation circuits 20 (FIG. 2 and FIG. 6) of the respective diagnosis apparatus 11 and 11A according to the above-described first and second embodiments. These residual-life calculation circuits 20 calculate the residual life of the rotating electrical machine 2.

The information items on the charge amount stored in the memory 16 (FIG. 2 and FIG. 6) of the diagnosis apparatus 11 and 11A may be amount of discharge intensity, discharge generation conditions, charge amount information, or relationship between the discharge strength and the discharge frequency as a combination of these two information items.

The database 21 stores the characteristics, which define the residual life of the rotating electrical machine 2, such as electrical breakdown characteristics. The database 21 stores information that functionally links those characteristics for defining the residual life. For example, the database 21 stores the first characteristic data 37A (FIG. 10) indicating the relationship between the residual life and the charge amount.

On the basis of the information on the charge amount stored in the memory 16 and the above-described calculation function or conversion coefficient, the residual-life calculation circuit 20 generates a graph (FIG. 10) of the first characteristic data 37A and the second characteristic data 37B. The first characteristic data 37A indicates the characteristics of the charge amount related to the partial discharge, and the second characteristic data 37B indicates the characteristics of the usage period (time) acquired from the current rotating electrical machine (i.e., rotating electrical machine in the current state). The residual-life calculation circuit 20 associates the first characteristic data 37A with the second characteristic data 37B so as to estimate the electrical breakdown characteristics (or BDV: Breakdown Voltage) indicating the relationship between the residual life of the rotating electrical machine 2 and the period of use.

Figure 10:
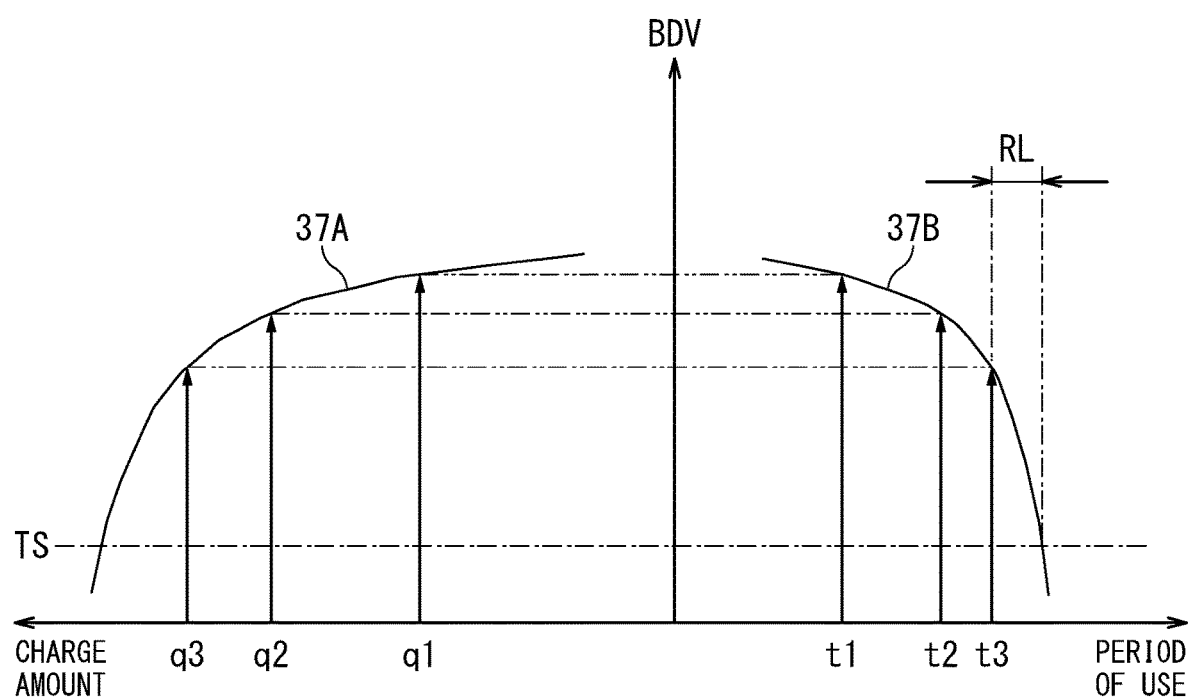
FIG. 10 is a graph illustrating relationship between charge amount and residual life in the third embodiment.

As shown in FIG. 10, the second characteristic data 37B of the current rotating electrical machine 2 defines its residual life. Thus, for example, in the case of observing the electrical breakdown characteristics (BDV), the characteristic threshold TS is set. When the charge amount is continuously measured and its trend is continuously obtained, the rate at which electrical breakdown characteristics (BDV) are directed toward the characteristic threshold TS can be estimated.

When the horizontal axis is defined as the period of use (time) of the rotating electrical machine 2 and the vertical axis is defined as the characteristics (BDV) for plotting, this rate corresponds to their inclination. This rate does not necessarily have to be linear and may be a non-linear function of a quadratic function or higher. When the time RL until the characteristic threshold TS is reached is calculated from this function and the time RL is set as the residual life, the residual life of the current rotating electrical machine 2 can be diagnosed.

As to the above-described trend, it is better to continuously calculate the residual life than calculating the residual life for a plurality of portions of the graph. The residual-life calculation circuit 20 visualizes the results obtained by the continuous calculation as the graph (FIG. 10) of the first characteristic data 37A and the second characteristic data 37B, and causes the display 12 (FIG. 1) to display the generated graph. In this manner, an administrator of the rotating electrical machine 2 can immediately notice sudden change in trend.

The display content of the display 12 (FIG. 1) may be the trend of the calculation result of the residual-life calculation circuit 20 or may be trend plots in which the horizontal axis is the period of use of the rotating electrical machine 2 and the vertical axis is the electrical breakdown characteristic (BDV). The display content is preferably a trend graph (FIG. 10) in which change in electrical breakdown characteristics (BDV) can be intuitively captured.

As described above, the residual-life calculation circuit 20 of the third embodiment calculates, as the residual life, the time RL until the charge amount related to the partial discharge reaches the preset characteristic threshold TS on the basis of the second characteristic data 37B. In this manner, the second characteristic data 37B of the current rotating electrical machine 2 contains the characteristics that define the residual life, and thus, the calculation accuracy of the residual life can be improved.

Fourth Embodiment

Figure 11:
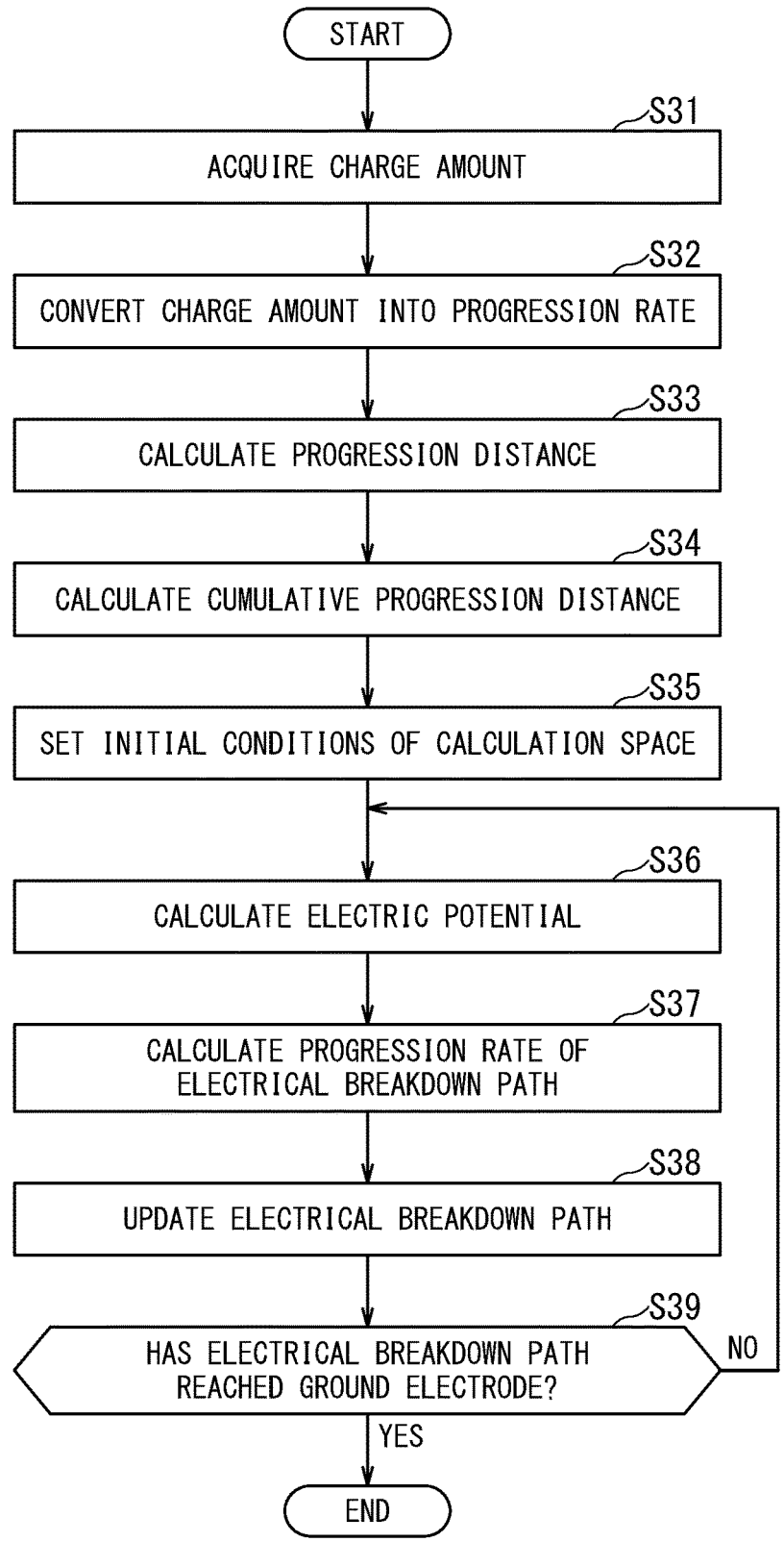
FIG. 11 is a flowchart illustrating a first case of the residual-life estimation method of the fourth embodiment.
Figure 12:
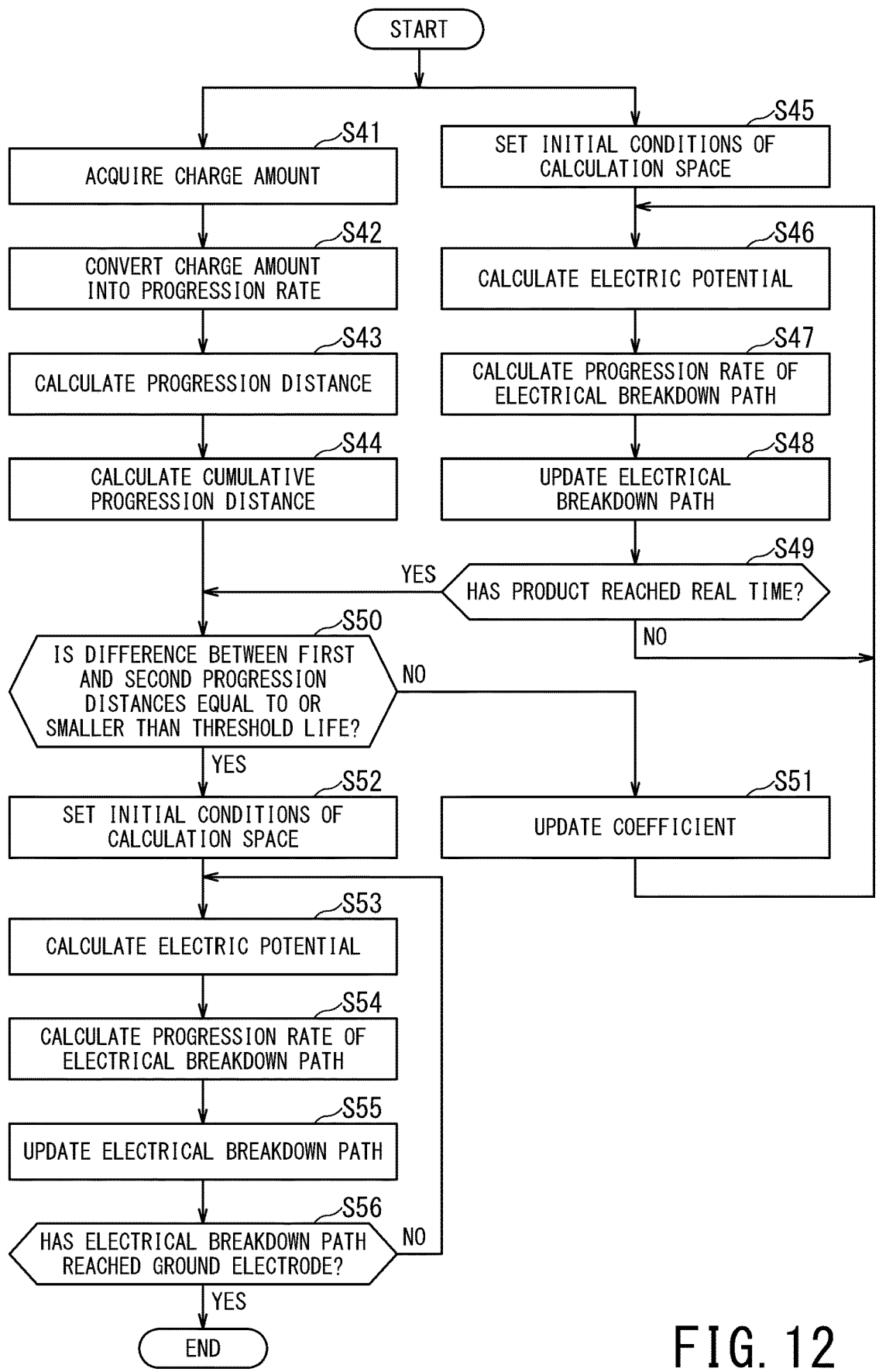
FIG. 12 is a flowchart illustrating a second case of the residual-life estimation method of the fourth embodiment.

Next, a description will be given of the insulation diagnostic system 1 and the insulation diagnostic method of the fourth embodiment on the basis of FIG. 11 and FIG. 12 by referring to the above-described figures as required. The components having the same configuration or function as the components in the above-described embodiment are denoted by the same reference signs, and duplicate description is omitted.

The fourth embodiment is another aspect of the residual life calculation method described in the third embodiment.

A detailed description will be given of the residua-life calculation processing (FIG. 3 and FIG. 7) to be executed by the residual-life calculation circuits 20 of the respective diagnosis apparatuses 11 and 11A according to the first and second embodiments.

The database 21 (FIG. 2 and FIG. 6) stores the characteristics that define the residual life of the rotating electrical machine 2, and such characteristics include a progression rate of an electrical breakdown path. The electrical breakdown path is a path in which the electric insulation resistance is reduced. The electrical breakdown path is generated or progresses by the partial discharge on the insulating material.

The electrical breakdown path progresses over time. When the electrical breakdown path reaches a ground electrode, the electrical breakdown occurs. The progression function of the progression rate of the electrical breakdown path and the information on the charge amount are obtained in advance. On the basis of this progression function, the progression rate of the electrical breakdown path can be calculated each time or sequentially.

The database 21 (FIG. 2 and FIG. 6) of the fourth embodiment stores the information on the charge amount and the progression function of the progression rate of the electrical breakdown path.

The residual-life calculation circuit 20 of the fourth embodiment execute the first processing of calculating the first progression distance d1 of the electrical breakdown path by time-integrating the progression rate, which is calculated from the progression function stored in the database 21 and the information on the charge amount related to the partial discharge calculated by the charge-amount calculation circuit 19.

Further, the residual-life calculation circuit 20 executes the second processing of calculating the second progression distance d2 of the electrical breakdown path by using a tool, which numerically models the progression of the electrical breakdown path, so as to calculate the residual life of the rotating electrical machine 2. In this manner, the progression rate of the electrical breakdown path can be acquired with high accuracy by capturing the change in progression rate.

First, the first processing will be described. As the electrical breakdown path progresses, the information items on the charge amount of the partial discharge to be calculated by the charge-amount calculation circuit 19 change sequentially. Thus, the progression rate also changes sequentially. The sequentially changing information items on the charge amount of the partial discharge can be converted into a progression rate on the basis of the progression function stored in the database 21, and thereby, the sequential change of the progression rate can be detected.

Further, the first progression distance d1 can be calculated with high accuracy by time-integrating the sequential change in the progression rate. When the first progression distance d1 obtained in this manner is accumulated, the cumulative value can be used as the first progression distance d1 of the electrical breakdown path in the current state.

Next, the second process will be described. In order to obtain the residual life of the rotating electrical machine 2 for the cumulative progression distance calculated in the first processing, the residual life is calculated by using the tool that models the progression of the electrical breakdown path by numerical calculation.

In the progression of the electrical breakdown path, the progression rate of the electrical breakdown path is an important factor, and the progression rate is obtained by using information items on the charge amount of the partial discharge as a factor. The information on the charge amount of the partial discharge indicates the electrical stress on the insulating material. Thus, the progression rate of the insulating material is approximated by Taylor expansion with electrical stress on the basis of Expression 2 below.

$$u = \sum_{m=0}^{M} k_m E^m \quad \text{(Expression 2)}$$

In Expression 2, u is the progression rate of the electrical breakdown path, E is an electric field related to the electrical stress applied to the electrical breakdown path, and $k_m$ is a coefficient of m-th order that associates u with E. In Expression 2, m is an integer. The maximum value M of the order m is preferably 1 or more because u is not a constant value, and is desirably 2 or more in the case of calculating the progression rate with higher accuracy in consideration of non-linearity.

The coefficient $k_m$ is referred to from the experimentally obtained value of the electric field function of the progression rate of the electrical breakdown path. The coefficient $k_m$ does not necessarily have to be a fixed function, and the coefficient $k_m$ may be updated from the change in the first progression distance d1 obtained in the first processing so as to match the change.

In order to obtain the electric field, it is necessary to know the electrical potential distribution in the calculation space. The electric potential distribution is calculated by using the Poisson's equation, i.e., Expression 3 below. In Expression 3, Φ is the electric potential in the calculation space, ρ is space charge, and ε is the permittivity (i.e., dielectric constant).

$$\nabla^2 \phi = -\frac{\rho}{\varepsilon} \quad \text{(Expression 3)}$$

For the electric potential calculation, it is preferred to use the Euler method, in which the calculation space is divided into predetermined distance differences in order to increase the calculation speed and then the electric potential is calculated. From the grid point information obtained by the Euler method, the information of all the points surrounded by the grid points is approximated by the interpolation function of Expressions 4 to 6 below. Expression 4 is used to calculate one-dimensional space. Expression 5 is used to calculate two-dimensional space. Expression 6 is used to calculate three-dimensional space.

$$F_{(X)} = \sum_{i=0}^{n} l_i X^i \quad \text{(Expression 4)}$$

$$F_{(X,Y)} = \sum_{i=0}^{n} \sum_{j=0}^{n} l_{i,j} X^i Y^j \quad \text{(Expression 5)}$$

In Expression 5, i+j≤n is the condition.

$$F_{(X,Y,Z)} = \sum_{i=0}^{n} \sum_{j=0}^{n} \sum_{k=0}^{n} l_{i,j,k} X^i Y^j Z^k \quad \text{(Expression 6)}$$

In Expression 6, i+j+k≤n is the condition.

In Expressions 4 to 6, F is a function that complements the electric potential at any point in the calculation space. In Expressions 4 to 6, X, Y, Z are respectively coordinate values in the X-axis, Y-axis, and Z-axis indicating distance from the grid point having been set as the origin among the grid points surrounding any points. In Expressions 4 to 6, 1 is a coefficient of each variable, and n is the order of the function and is related to the accuracy of the interpolation function. The higher the order is, the higher the accuracy of the interpolation function becomes. There is also a need to reduce the order for preventing computational complications. The order is preferably at least 1 or more because the electric potential is not a constant value, and is preferably 2 or more in the case of executing the calculation with higher accuracy in consideration of non-linearity.

Since the second processing can calculate the electric field obtained from the electric potential in the calculation space and the second progression distance d2 of the electrical breakdown path corresponding to the obtained electric field, the residual life of the rotating electrical machine 2 can be accurately acquired by numerical calculation.

In the fourth embodiment, the first processing of calculating the current progression distance can be executed in parallel with the second processing, in which the coefficient to be used for calculating the current progression distance is updated so as to become closer to the actual state of the rotating electrical machine 2 to be measured.

Further, in the fourth embodiment, the absolute value of the difference between the first progression distance d1 obtained by the first processing and the second progression distance d2 obtained by the second processing converges so as to be equal to or less than the threshold error Δ, and thereby, the first and second progression distances d1 and d2 can be adapted to the insulation configuration of the target rotating electrical machine 2.

Convergence of the second progression distance d2 is performed by, for example, changing the coefficient $k_m$, which is the parameter of the progression rate of the electrical breakdown path in Expression 7 below. The left side of Expression 7 is the parameter $k_m^{i+1}$ of the progression rate obtained from the $k_m^i$ used in the current calculation. Since the coefficient $k_m$ has a positive correlation with the progression rate, the coefficient $k_m$ also has a positive correlation with the second progression distance d2 of the second processing. Thus, according to Expression 7, the coefficient $k_m$ can be changed so as to bring the second progression distance d2 of the second processing closer to the first progression distance d1 of the first processing.

$$k_m^{i+1} = \frac{d_1}{d_2} k_m^i \quad \text{(Expression 7)}$$

It is assumed that the value obtained as the first progression distance d1 is the true value. Expression 7 represents a convergence method for bringing the calculated second progression distance d2 closer to the true value. Another expression indicative of the threshold error Δ is Expression 8 below.

$$\frac{\text{THRESHOLD ERROR}}{\text{TRUE VALUE}} = \frac{|\text{CALCULATED VALUE} - \text{TRUE VALUE}|}{\text{TRUE VALUE}} = \frac{|d_2 - d_1|}{d_1} = \frac{\Delta}{d_1} \quad \text{(Expression 8)}$$

The smaller the threshold error Δ becomes, the higher the calculation accuracy becomes. However, a smaller threshold error Δ is characterized by extension of the calculation time.

For example, in the case of the rotating electrical machine 2 with an initial life of 30 years, it is assumed that this rotating electrical machine 2 will be renewed 3 months before the initial life. In this case, an error of 0.8% is acceptable (i.e., allowable). When the error (i.e., difference) of the progression distance is assumed to be directly linked to the error for obtaining the residual life, the threshold error Δ, which is the acceptable limit, is preferably 0.8/100 of the first progression distance d1.

In the case of the rotating electrical machine 2 with an initial life of 20 years, the threshold error Δ is preferably set to 1.25/100 of the first progression distance d1. In the case of the rotating electrical machine 2 with an initial life of 10 years, the threshold error Δ is preferably set to 2.5/100 of the first progression distance d1. In the case of the rotating electrical machine 2 with an initial life of 5 years, the threshold error Δ is preferably set to 5/100 of the first progression distance d1.

According to the fourth embodiment, as the obtained data are increased, the coefficient $k_m$ of Expression 7 can be adapted to the insulation characteristics of the target rotating electrical machine 2. Thus, the residual life can be calculated more accurately.

The most appropriate convergence condition is applied in consideration of calculation accuracy and calculation time. In consideration of the calculation accuracy, the threshold error Δ is preferably set to 5/100 of the first progression distance d1. In consideration of the calculation time, the threshold error Δ is preferably set to 0.8/100 of the first progression distance d1. Thus, the threshold error Δ is preferably in the range of 0.8/100 to 5/100 (range of 0.8% to 5.0%) with respect to the first progression distance d1.

In the fourth embodiment, the threshold error Δ of the rotating electrical machine 2 is set on the basis of the value obtained by dividing the absolute value of the difference between the first progression distance d1 and the second progression distance d2 by the first progression distance d1. In this manner, the administrator can renew the rotating electrical machine 2 at an appropriate timing.

Next, a description will be given of the first case of the residual-life estimation method to be executed by the insulation diagnostic system 1 of the fourth embodiment on the basis of the flowchart of FIG. 11 by referring to the above-described figures as required.

In this first case, the steps S31 to S34 constitute the current-state analysis processing. This current-state analysis processing is processing of analyzing the progression distance in the current state. The steps S35 to S38 constitute future prediction processing. This future prediction processing is processing of predicting the progression distance in the future.

First, in the step S31, the residual-life calculation circuit 20 acquires the charge amount of the partial discharge calculated by the charge-amount calculation circuit 19.

In the next step S32, the residual-life calculation circuit 20 converts the acquired charge amount into the progression rate on the basis of the progression function.

In the next step S33, the residual-life calculation circuit 20 calculates the progression distance of the electrical breakdown path on the basis of the product of the converted progression rate and the time derivative.

In the next step S34, the residual-life calculation circuit 20 calculates the cumulative progression distance (i.e., progression distance in the current state) by accumulating the calculated progression distances.

In the next step S35, the residual-life calculation circuit 20 sets initial conditions of the calculation space.

In the next step S36, the residual-life calculation circuit 20 calculates the electric potential distribution in the calculation space.

In the next step S37, the residual-life calculation circuit 20 calculates the progression rate of the electrical breakdown path in accordance with the electric field obtained from the electric potential in the calculation space.

In the next step S38, the residual-life calculation circuit 20 calculates the progression distance (i.e., progression distance in the future) from the product of the obtained progression rate and the time derivative so as to update the information on the electrical breakdown path in the calculation space.

In the next step S39, the residual-life calculation circuit 20 determines whether the obtained electrical breakdown path has reached the ground electrode or not. If the electrical breakdown path has not reached the ground electrode (NO in the step S39), the processing returns to above-described step S36. The processing of the steps S36 to S39 is repeated until the calculation result that the electrical breakdown path has reached the ground electrode is derived. If the electrical breakdown path has reached the ground electrode (YES in the step S39), the residual-life estimation method is completed. The residual life of the rotating electrical machine 2 is calculated on the basis of the elapsed time required for the electrical breakdown path to reach the ground electrode obtained in this processing.

Next, a description will be given of the second case of the residual-life estimation method to be executed by the insulation diagnostic system 1 of the fourth embodiment on the basis of the flowchart of FIG. 12 by referring to the above-described figures as required.

In this second case, the steps S41 to S51 are the current-state analysis processing in which the steps S41 to S44 constitute the first processing and the steps S45 to S51 constitute the second processing. Further, the steps S52 to S55 constitute the future prediction processing.

First, in the step S41, the residual-life calculation circuit 20 acquires the charge amount of the partial discharge calculated by the charge-amount calculation circuit 19.

In the next step S42, the residual-life calculation circuit 20 converts the acquired charge amount into the progression rate on the basis of the progression function.

In the next step S43, the residual-life calculation circuit 20 calculates the progression distance of the electrical breakdown path on the basis of the product of the converted progression rate and the time derivative.

In the next step S44, the residual-life calculation circuit 20 accumulates the calculated progression distances so as to obtain the first progression distance d1 (i.e., cumulative progression distance).

The processing of the steps S45 to S48 below is executed in parallel with the processing of the above-described steps S41 to S44. First, in the step S45, the residual-life calculation circuit 20 sets the initial conditions of the calculation space.

In the next step S46, the residual-life calculation circuit 20 calculates the electric potential distribution in the calculation space.

In the next step S47, the residual-life calculation circuit 20 calculates the progression rate of the electrical breakdown path in accordance with the electric field obtained from the electric potential in the calculation space.

In the next step S48, the residual-life calculation circuit 20 calculates the second progression distance d2 from the product of the obtained progression rate and the time derivative so as to update the information on the electrical breakdown path in the calculation space.

In the next step S49, the residual-life calculation circuit 20 determines whether the product of the number of times of calculation from the steps S46 to S48 and the time derivative has reached the real time indicating the operating time of the rotating electrical machine 2 in the current state or not. If the product has reached the real time (YES in the step S49), the processing proceeds to the step S50. Conversely, if the product has not reached the real time (NO in the step S49), the processing returns to the step S46. For example, in the case of the rotating electrical machine 2 that has been in operation for a total of 10 years from its installation to the present time, the calculations from the steps S46 to S48 are repeated until the calculations give the second progression distance d2 for the rotating electrical machine 2 which is ten years after the installation.

In the step S50 subsequent to the steps S44 and S49, the residual-life calculation circuit 20 calculates the difference between the first progression distance d1 obtained in the first processing and the second progression distance d2 obtained in the second processing. The residual-life calculation circuit 20 determines whether the calculated difference is equal to or smaller than the threshold error $\Delta$. If the calculated difference is larger than the threshold error $\Delta$ (NO in the step S50), the processing proceeds to the step S51. If the calculated difference is equal to or smaller than the threshold error $\Delta$ (YES in the step S50), the processing proceeds to the step S52.

In the step S51 subsequent to the case of NO in the step S50, the residual-life calculation circuit 20 updates the coefficient $k_m$ such that the updated coefficient $k_m$ matches the change in the first progression distance d1 obtained in the first processing. Afterward, the processing returns to the above-described step S46.

In the step S52 subsequent to the case of YES in the step S50, the residual-life calculation circuit 20 sets the initial conditions of the calculation space.

In the next step S53, the residual-life calculation circuit 20 calculates the electric potential distribution in the calculation space.

In the next step S54, the residual-life calculation circuit 20 calculates the progression rate of the electrical breakdown path in accordance with the electric field obtained from the electric potential in the calculation space.

In the next step S55, the residual-life calculation circuit 20 calculates the progression distance (i.e., progression distance in the future) from the product of the obtained progression rate and the time derivative so as to update the information on the electrical breakdown path in the calculation space.

In the next step S56, the residual-life calculation circuit 20 determines whether the obtained electrical breakdown path has reached the ground electrode or not. If the electrical breakdown path has not reached the ground electrode (NO in the step S56), the processing returns to above-described step S53. The processing of the steps S53 to S56 is repeated until the calculation result that the electrical breakdown path has reached the ground electrode is derived. If the electrical breakdown path has reached the ground electrode (YES in the step S56), the residual-life estimation method is completed. The residual life of the rotating electrical machine 2 is calculated on the basis of the elapsed time required for the electrical breakdown path to reach the ground electrode obtained in this processing.

Although the insulation diagnostic system and the insulation diagnostic method has been described on the basis of the first to the fourth embodiments, the configuration applied in any one of the embodiments may be applied to other embodiments or the configurations in the respective embodiments may be applied in combination.

In the above-described embodiments, the determination of one target value using a reference value (i.e., the characteristic threshold, the threshold error or the trigger voltage) may be determination of whether the target value is equal to or larger than the reference value or not. Additionally or alternatively, the determination of the target value using the reference value may be determination of whether the target value exceeds the reference value or not. Additionally or alternatively, the determination of the target value using the reference value may be determination of whether the target value is equal to or smaller than the reference value or not. Additionally or alternatively, the determination of the one value using the reference value may be determination of whether the target value is smaller than the reference value or not. Additionally or alternatively, the reference value is not necessarily fixed and the reference value may be changed. Thus, a predetermined range of values may be used instead of the reference value, and the determination of the target value may be determination of whether the target value is within the predetermined range or not. In addition, an error occurring in the apparatus may be analyzed in advance, and the predetermined range including the error range centered on the reference value may be used for determination.

Although a mode in which each step is executed in series is illustrated in the flowcharts of the above-described embodiments, the execution order of the respective steps is not necessarily fixed and the execution order of part of the steps may be changed. Additionally, some steps may be executed in parallel with another step.

The system in the above-described embodiments include a storage device such as a Read Only Memory (ROM) and a Random Access Memory (RAM), an external storage device such as a Hard Disk Drive (HDD) and a Solid State Drive (SSD), a display device such as a display panel, an input device such as a mouse and a keyboard, a communication interface, and a control device which has a highly integrated processor such as a special-purpose chip, a Field Programmable Gate Array (FPGA), a Graphics Processing Unit (GPU), and a Central Processing Unit (CPU). The system can be achieved by hardware configuration with the use of the normal computer.

Note that each program executed in the system of above-described embodiments are provided by being incorporated in a memory such as a ROM in advance. Additionally or alternatively, each program may be provided by being stored as a file of installable or executable format in a non-transitory computer-readable storage medium such as a CD-ROM, a CD-R, a memory card, a DVD, and a flexible disk (FD).

In addition, each program executed in the system may be stored on a computer connected to a network such as the Internet and be provided by being downloaded via a network. Further, the system can be also configured by interconnecting and combining separate modules, which independently exhibit respective functions of the components, via a network or a dedicated line.

According to at least one of the embodiments described above, the charge-amount calculation circuit configured to calculate the charge amount related to the partial discharge of the rotating electrical machine is provided, and thus, the voltage signal acquired by the sensor can be converted into the charge amount that serves as an index of insulation diagnosis.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An insulation diagnostic system comprising:
    a peak-value acquisition circuit configured to acquire at least one peak value of a section corresponding to local discharge of a voltage signal acquired by at least one sensor that detects the voltage signal in a non-contact manner, the voltage signal being a signal propagating through a conductor connected to a rotating electrical machine;
    a function acquisition circuit configured to acquire a calculation function for calculating charge amount related to the discharge based on at least two peak values acquired from the voltage signal that is detected by the sensor by applying a test voltage to the rotating electrical machine while the rotating electrical machine is stopped; and
    a charge-amount calculation circuit configured to calculate the charge amount related to partial discharge of the rotating electrical machine based on the calculation function and the peak value obtained from the voltage signal that is detected by the sensor during operation of the rotating electrical machine.

2. The insulation diagnostic system according to claim 1, wherein the peak value is a value at which an absolute value is maximized.

3. The insulation diagnostic system according to claim 1, wherein:
    the function acquisition circuit is configured to:
        acquire at least two test data indicating relationship between a known charge amount and a known peak value when the test voltage is applied to the rotating electrical machine, and
        acquire the calculation function from a graph of an approximate curve obtained from the at least two test data; and
    the charge-amount calculation circuit is configured to calculate an unknown charge amount from a newly acquired peak value based on the calculation function.

4. The insulation diagnostic system according to claim 1, further comprising:
    a database configured to store residual-life information indicating relationship between the charge amount and residual life of the rotating electrical machine; and
    a residual-life calculation circuit configured to calculate the residual life of the rotating electrical machine from the charge amount related to the partial discharge and the residual-life information stored in the database.

5. The insulation diagnostic system according to claim 4, wherein the residual-life calculation circuit is configured to:

estimate an electrical breakdown characteristic of the rotating electrical machine by associating first characteristic data with second characteristic data, the first characteristic data indicating a characteristic of the charge amount related to the partial discharge, the second characteristic data indicating a characteristic of a period of use acquired from the rotating electrical machine in a current state; and calculate time length required for the charge amount related to the partial discharge to reach a preset characteristic threshold, as the residual life, based on the electrical breakdown characteristic.

6. The insulation diagnostic system according to claim 4, wherein:

the database is configured to store information on the charge amount and a progression function of a progression rate of an electrical breakdown path; and the residual-life calculation circuit is configured to calculate the residual life by executing first processing and second processing, the first processing being processing of calculating a first progression distance of the electrical breakdown path by time-integrating the progression rate calculated from the progression function and the information on the charge amount, the second processing being processing of calculating a second progression distance of the electrical breakdown path by a tool that models progression of the electrical breakdown path by numerical calculation.

7. The insulation diagnostic system according to claim 6, wherein an acceptable threshold error at a time of calculating the residual life is set based on a value obtained by dividing an absolute value of difference between the first progression distance and the second progression distance by the first progression distance.

8. The insulation diagnostic system according to claim 1, wherein, when a reference voltage equal to or higher than a preset trigger voltage is detected by the sensor, at least one specific period before and after detection of the reference voltage is set as the section.

9. An insulation diagnostic system comprising:

a spectrum acquisition circuit configured to acquire a spectrum of a section corresponding to local discharge of a voltage signal obtained by at least one sensor that detects the voltage signal in a non-contact manner, the voltage signal being a signal propagating through a conductor connected to a rotating electrical machine;

a coefficient acquisition circuit configured to acquire a conversion coefficient represented by a ratio between two spectra corresponding to respective two points obtained from the voltage signal that is detected by the sensor by applying a test voltage to the two points while the rotating electrical machine is stopped, the two points including a point of a measurement target of the rotating electrical machine and a point of the sensor;

a waveform restoration circuit configured to restore a time waveform of the voltage signal at an occurrence time of partial discharge at the point of the measurement target, based on the conversion coefficient and the spectrum obtained from the voltage signal detected by the sensor during operation of the rotating electrical machine; and a charge-amount calculation circuit configured to calculate charge amount related to the partial discharge from the time waveform.

10. The insulation diagnostic system according to claim 9, wherein the charge-amount calculation circuit is configured to offset the time waveform.

11. The insulation diagnostic system according to claim 9, wherein the charge-amount calculation circuit is configured to:

calculate a specific value (MK) by multiplying a maximum value (M) among absolute values in the time waveform by a specific coefficient (K); and calculate the charge amount from a first range and a second range in the time waveform, the first range being a range in which each value is a negative specific value (−MK) or lower, the second range being a range in which each value is a positive specific value (+MK) or higher.

12. The insulation diagnostic system according to claim 9, wherein the charge-amount calculation circuit is configured to:

extract digital data in a range from a maximum value when absolute values of the time waveform are arranged in descending order to a preset specific point; and calculate the charge amount from the digital data.

13. The insulation diagnostic system according to claim 9, wherein the charge-amount calculation circuit is configured to calculate the charge amount based on a quotient that is obtained by dividing a sum of products of absolute values of the time waveform and time derivative by an impedance value of detection impedance.

14. An insulation diagnostic method comprising steps of:

acquiring at least one peak value of a section corresponding to local discharge of a voltage signal acquired by at least one sensor that detects the voltage signal in a non-contact manner, the voltage signal being a signal propagating through a conductor connected to a rotating electrical machine;

acquiring a calculation function for calculating charge amount related to the discharge based on at least two peak values acquired from the voltage signal that is detected by the sensor by applying a test voltage to the rotating electrical machine while the rotating electrical machine is stopped; and calculating the charge amount related to partial discharge of the rotating electrical machine based on the calculation function and the peak value obtained from the voltage signal that is detected by the sensor during operation of the rotating electrical machine.

15. An insulation diagnostic method comprising steps of:

acquiring a spectrum of a section corresponding to local discharge of a voltage signal obtained by at least one sensor that detects the voltage signal in a non-contact manner, the voltage signal being a signal propagating through a conductor connected to a rotating electrical machine;

acquiring a conversion coefficient represented by a ratio between two spectra corresponding to respective two points obtained from the voltage signal that is detected by the sensor by applying a test voltage to the two points while the rotating electrical machine is stopped, the two points including a point of a measurement target of the rotating electrical machine and a point of the sensor;

restoring a time waveform of the voltage signal at an occurrence time of partial discharge at the point of the measurement target, based on the conversion coefficient and the spectrum obtained from the voltage signal detected by the sensor during operation of the rotating electrical machine; and calculating charge amount related to the partial discharge from the time waveform.

* * * * *

UNITED STATES PATENT AND TRADEMARK OFFICE
CERTIFICATE OF CORRECTION

| | |
|---|---|
| PATENT NO. | : 11,579,180 B2 |
| APPLICATION NO. | : 17/646066 |
| DATED | : February 14, 2023 |
| INVENTOR(S) | : Takashi Harakawa et al. |

It is certified that error appears in the above-identified patent and that said Letters Patent is hereby corrected as shown below:

On the Title Page

Item (73), the Assignee information is incorrect. Item (73) should read:
-- (73) Assignees: KABUSHIKI KAISHA TOSHIBA, Tokyo (JP); TOSHIBA ENERGY SYSTEMS & SOLUTIONS CORPORATION, Kawasaki (JP) --

Signed and Sealed this
Twenty-seventh Day of June, 2023

Katherine Kelly Vidal
*Director of the United States Patent and Trademark Office*